US012227823B2

(12) United States Patent
Oka et al.

(10) Patent No.: US 12,227,823 B2
(45) Date of Patent: Feb. 18, 2025

(54) METAL PLATE FOR PRODUCING VAPOR DEPOSITION MASKS, PRODUCTION METHOD FOR METAL PLATES, VAPOR DEPOSITION MASK, PRODUCTION METHOD FOR VAPOR DEPOSITION MASK, AND VAPOR DEPOSITION MASK DEVICE COMPRISING VAPOR DEPOSITION MASK

(71) Applicant: Dai Nippon Printing Co., Ltd., Tokyo (JP)

(72) Inventors: Hiroki Oka, Tokyo (JP); Sachiyo Matsuura, Tokyo (JP); Chiaki Hatsuta, Tokyo (JP); Chikao Ikenaga, Tokyo (JP); Hideyuki Okamoto, Tokyo (JP); Masato Ushikusa, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 450 days.

(21) Appl. No.: 16/680,942

(22) Filed: Nov. 12, 2019

(65) Prior Publication Data

US 2020/0149139 A1 May 14, 2020

(30) Foreign Application Priority Data

Nov. 13, 2018 (WO) ............... PCT/JP2018/041915
Nov. 13, 2018 (WO) ............... PCT/JP2018/041918
(Continued)

(51) Int. Cl.
C22C 38/10 (2006.01)
B21B 1/22 (2006.01)
(Continued)

(52) U.S. Cl.
CPC ............. $C22C\ 38/105$ (2013.01); $B21B\ 1/22$ (2013.01); $C21D\ 6/001$ (2013.01); $C21D\ 8/0205$ (2013.01);
(Continued)

(58) Field of Classification Search
CPC ....... C22C 38/105; C22C 38/08; C22C 38/10; C21D 6/001; C21D 8/0205; C21D 8/0226;
(Continued)

(56) References Cited

U.S. PATENT DOCUMENTS 6,547,893 B1 4/2003 Itoh et al.
6,559,583 B1 5/2003 Kanayama et al.
(Continued)

FOREIGN PATENT DOCUMENTS

CN 102692184 B 7/2014
CN 105004786 A 10/2015
(Continued)

OTHER PUBLICATIONS

Espacenet machine translation of WO 2018235862 A1 (Year: 2021).*
E112-13, ASTM International, Feb. 2014, DOI:10.1520/E0112-13. (Year: 2014).*
(Continued)

Primary Examiner — Ricardo D Morales
(74) Attorney, Agent, or Firm — BURR PATENT LAW, PLLC

(57) ABSTRACT

A metal plate used for manufacturing a deposition mask has a thickness of equal to or less than 30 μm. An average cross-sectional area of the crystals grains on a cross section of the metal plate is from 0.5 μm² to 50 μm². The average cross-sectional area of crystal grains is calculated by analyzing measurement results obtained by an EBSD method, the measuring results being analyzed by an area method
(Continued)

under conditions where a portion with a difference in crystal orientation of 5 degrees or more is recognized as a crystal grain boundary.

14 Claims, 20 Drawing Sheets

(30) Foreign Application Priority Data

Nov. 13, 2018 (WO) .................. PCT/JP2018/041919
May 13, 2019 (JP) ................................ 2019-090946

(51) Int. Cl.
| | |
|---|---|
| C21D 6/00 | (2006.01) |
| C21D 8/02 | (2006.01) |
| C21D 9/46 | (2006.01) |
| C22C 38/08 | (2006.01) |
| C23C 2/26 | (2006.01) |
| C23C 14/04 | (2006.01) |
| C23C 14/24 | (2006.01) |
| C25D 1/04 | (2006.01) |
| C25D 3/56 | (2006.01) |
| G03F 7/00 | (2006.01) |
| G03F 7/20 | (2006.01) |
| H10K 50/11 | (2023.01) |
| H10K 59/00 | (2023.01) |
| H10K 71/00 | (2023.01) |
| H10K 71/16 | (2023.01) |
| H10K 77/10 | (2023.01) |

(52) U.S. Cl.
CPC ......... *C21D 8/0226* (2013.01); *C21D 8/0247* (2013.01); *C21D 9/46* (2013.01); *C22C 38/08* (2013.01); *C23C 2/26* (2013.01); *C23C 14/042* (2013.01); *C23C 14/24* (2013.01); *C25D 1/04* (2013.01); *C25D 3/562* (2013.01); *G03F 7/0015* (2013.01); *G03F 7/0027* (2013.01); *G03F 7/0035* (2013.01); *G03F 7/2008* (2013.01); *G03F 7/2022* (2013.01); *H10K 71/00* (2023.02); *H10K 71/166* (2023.02); *H10K 77/10* (2023.02); *C21D 2201/05* (2013.01); *H10K 50/11* (2023.02); *H10K 59/00* (2023.02)

(58) Field of Classification Search
CPC .................. C21D 9/46; C21D 2201/05; C21D 2261/00; C21D 1/76; C21D 6/007; C21D 8/0236; C21D 8/0273; H01L 51/0011; H01L 51/0096; Y02E 10/549; Y02P 70/50; C23C 2/26; C23C 14/042
See application file for complete search history.

(56) References Cited

U.S. PATENT DOCUMENTS

| | | | | |
|---|---|---|---|---|
| 6,686,693 | B1 * | 2/2004 | Ogawa .................. | H10K 50/81 |
| | | | | 313/506 |
| 2002/0006350 | A1 | 1/2002 | Nishida et al. | |
| 2002/0017395 | A1 | 2/2002 | Hirose et al. | |
| 2002/0039693 | A1 | 4/2002 | Kurosaki | |
| 2009/0084683 | A1 | 4/2009 | Campestrini et al. | |
| 2017/0141315 | A1 | 5/2017 | Ikenaga | |
| 2017/0198383 | A1 | 7/2017 | Chang et al. | |
| 2018/0023182 | A1 | 1/2018 | Ikenaga et al. | |
| 2018/0038002 | A1 | 2/2018 | Tamura et al. | |
| 2018/0065162 | A1 | 3/2018 | Mikami et al. | |
| 2018/0066352 | A1 | 3/2018 | Tamura et al. | |

FOREIGN PATENT DOCUMENTS

| | | | |
|---|---|---|---|
| EP | 3 144 410 | A1 | 3/2017 |
| EP | 3 257 964 | A1 | 12/2017 |
| JP | S61-039344 | A1 | 2/1986 |
| JP | S63-016525 | A1 | 1/1988 |
| JP | H05-144384 | A1 | 6/1993 |
| JP | H08-220778 | A | 8/1996 |
| JP | H08-269742 | A1 | 10/1996 |
| JP | H11-219986 | A1 | 8/1999 |
| JP | 2001-234385 | A1 | 8/2001 |
| JP | 2002-012998 | A1 | 1/2002 |
| JP | 2002-035804 | A | 2/2002 |
| JP | 2002-194573 | A1 | 7/2002 |
| JP | 2004-183023 | A1 | 7/2004 |
| JP | 2004-185890 | A1 | 7/2004 |
| JP | 2008-293841 | A1 | 12/2008 |
| JP | 2010-214447 | A1 | 9/2010 |
| JP | 2010-247500 | A1 | 11/2010 |
| JP | 5382259 | B1 | 1/2014 |
| JP | 2014-148743 | A1 | 8/2014 |
| JP | 2015-098650 | A1 | 5/2015 |
| JP | 2015-129334 | A1 | 7/2015 |
| JP | 2015-168847 | A1 | 9/2015 |
| JP | 2015-168884 | A1 | 9/2015 |
| JP | 2016-108643 | A1 | 6/2016 |
| JP | 2016-121376 | A1 | 7/2016 |
| JP | 2016-135505 | A1 | 7/2016 |
| JP | 2016-1355505 | A1 | 7/2016 |
| JP | 2017-064763 | A1 | 4/2017 |
| JP | 2017-066530 | A1 | 4/2017 |
| JP | 2017-088914 | A1 | 5/2017 |
| JP | 2017-088915 | A1 | 5/2017 |
| JP | 2017-101302 | A1 | 6/2017 |
| JP | 2017-125253 | A1 | 7/2017 |
| JP | 2017-141500 | A1 | 8/2017 |
| JP | 2017-166029 | A | 9/2017 |
| JP | 2018-040055 | A1 | 3/2018 |
| KR | 10-2003-0043635 | A | 6/2003 |
| WO | 2015/174269 | A1 | 11/2015 |
| WO | 2016/129533 | A1 | 8/2016 |
| WO | 2017/013904 | A1 | 1/2017 |
| WO | 2017/014016 | A1 | 1/2017 |
| WO | 2017/014172 | A1 | 1/2017 |
| WO | 2018/043641 | A1 | 3/2018 |
| WO | 2018/043642 | A1 | 3/2018 |
| WO | WO-2018235862 | A1 * | 12/2018 ............... C21D 9/46 |

OTHER PUBLICATIONS

JIS G 0551:2013, Japanese Standards Association (2013) (Year: 2013).*
Ryde, L. "Application of EBSD to analysis of microstructures in commercial steels." Materials Science and Technology 22.11 (2006): 1297-1306. (Year: 2006).*
Chinese Office Action (Application No. 201811344277.0) dated Jul. 16, 2020 (with English translation).
European Search Report (Application No. 18879902.7) dated Aug. 17, 2021.
Japanese Office Action (Application No. 2018-563643) dated Feb. 1, 2019 (with English translatlon).
Japanese Office Action (Application No. 2018-563643) dated Mar. 29, 2019 (with English translation).
International Search Report and Written Opinion (Application No. PCT/JP2018/041915) dated Feb. 5, 2019.
International Search Report and Written Opinion (Application No. PCT/JP2018/041918) dated Feb. 12, 2019
International Search Report and Written Opinion (Application No. PCT/JP2018/041919) dated Feb. 12, 2019.
English translation of International Preliminary Report on Patentability (Chapter I) (Application No. PCT/JP2018/041915) dated May 28, 2020.
English translation of International Preliminary Report on Patentability (Chapter I) (Application No. PCT/JP2018/041918) dated May 28, 2020.

(56) References Cited

OTHER PUBLICATIONS

English translation of International Preliminary Report on Patentability (Chapter I) (Application No. PCT/JP2018/041919) dated May 28, 2020.
Japanese Office Action (Application No. 2019-122142) dated Aug. 28, 2020 (with English translation).
Extended European Search Report (Application No. 18879989.4) dated Jul. 13, 2021.
U.S. Appl. No. 16/578,291, filed Sep. 21, 2019, Hiroki Oka.
U.S. Appl. No. 16/580,401, filed Sep. 24, 2019, Chikao Ikenaga.
U.S. Appl. No. 16/580,524, filed Sep. 24, 2019, Chikao Ikenaga.
Extended European Search Report (Application No. 19208503.3) dated Feb. 11, 2020
Japanese Office Action (Application No. 2021-133631) dated Jan. 28, 2022 (with English translation).
Partial Supplementary European Search Report (Application No. 18879719.5) dated Oct. 1, 2021.
U.S. Office Action dated Sep. 30, 2022 (U.S. Appl. No. 17/168,496).
U.S. Office Action dated Apr. 6, 2023 (U.S. Appl. No. 17/168,496).
Taiwanese Office Action (with English translation) dated Jan. 4, 2023 (Application No. 108141150).
Korean Office Action (with English translation), Korean Application No. 10-2020-7016167, dated Jan. 29, 2024 (15 pages).
Vander Voort, "*Committee E-4 and Grain Size Measurements: 75 Years of Progress*," ASTM Standard News, May 1991.
ASTM E112-13, "*Standard Test Methods for Determining Average Grain Size*," 2013 (Year: 2013).
U.S. Office Action dated Feb. 26, 2024 (U.S. Appl. No. 17/168,496).
Japanese Office Action (Application No. 2021-133631) dated Sep. 10, 2021 (with English translation).
Tanikawa, Keiichi, "*Surface Chemistry of Cold Rolling Oil*," vol. 10, Issue 7, pp. 448-455 (Mar. 13, 1989).

\* cited by examiner

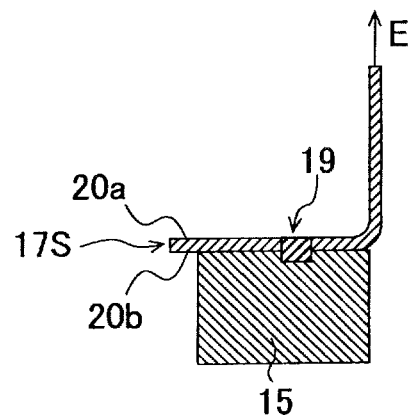

FIG. 24

| | THICK-NESS ($\mu$m) | TEST | | | STRENGTH | WELDABILITY | |
|---|---|---|---|---|---|---|---|
| | | AREA AVERAGE CROSS-SECTIONAL AREA ($\mu m^2$) | JUDGMENT | NUMBER AVERAGE CROSS-SECTIONAL AREA ($\mu m^2$) | NUMBER OF DEFORMED PORTIONS | WELDING STRENGTH (mN) | CRACK |
| EXAMPLE 1 | 40 | 113.4 | NG | 10.1 | 0 | 404 | ABSENT |
| EXAMPLE 2 | 35 | 72.0 | NG | 6.8 | 0 | 288 | ABSENT |
| EXAMPLE 3 | 30 | 48.4 | OK | 2.8 | 0 | 318 | ABSENT |
| EXAMPLE 4 | 30 | 64.8 | NG | 7.0 | 3 | 335 | ABSENT |
| EXAMPLE 5 | 25 | 43.8 | OK | 3.2 | 0 | 311 | ABSENT |
| EXAMPLE 6 | 20 | 63.0 | NG | 5.3 | 6 | 298 | ABSENT |
| EXAMPLE 7 | 20 | 39.5 | OK | 2.6 | 0 | 271 | ABSENT |
| EXAMPLE 8 | 20 | 46.0 | OK | 2.5 | 0 | 305 | ABSENT |
| EXAMPLE 9 | 20 | 0.37 | NG | 0.19 | 0 | 189 | PRESENT |
| EXAMPLE 10 | 15 | 54.3 | NG | 3.5 | 15 | 351 | ABSENT |
| EXAMPLE 11 | 15 | 18.4 | OK | 1.6 | 0 | 255 | ABSENT |
| EXAMPLE 12 | 15 | 7.4 | OK | 0.8 | 0 | 235 | ABSENT |
| EXAMPLE 13 | 15 | 2.0 | OK | 0.4 | 0 | 220 | ABSENT |
| EXAMPLE 14 | 13 | 5.9 | OK | 0.23 | 0 | 221 | ABSENT |
| EXAMPLE 15 | 10 | 0.16 | NG | 0.06 | 0 | 142 | PRESENT |
| EXAMPLE 16 | 10 | 0.33 | NG | 0.11 | 0 | 157 | PRESENT |

FIG. 25

METAL PLATE FOR PRODUCING VAPOR DEPOSITION MASKS, PRODUCTION METHOD FOR METAL PLATES, VAPOR DEPOSITION MASK, PRODUCTION METHOD FOR VAPOR DEPOSITION MASK, AND VAPOR DEPOSITION MASK DEVICE COMPRISING VAPOR DEPOSITION MASK

CROSS-REFERENCE TO RELATED APPLICATIONS

This application is based upon and claims the benefit of priority from International Application No. PCT/JP2018/041915, filed on Nov. 13, 2018, International Application No. PCT/JP2018/041918, filed Nov. 13, 2018, International Application No. PCT/JP2018/041919, filed Nov. 13, 2018, and Japanese Patent Application No. 2019-090946, filed May 13, 2019. The entire contents of these applications are incorporated herein by reference.

BACKGROUND

Field

Embodiments of the present disclosure relate to a metal plate for manufacturing a deposition mask and a method for manufacturing a metal plate. In addition, embodiments of the disclosure relate to a deposition mask, a method for manufacturing a deposition mask, and a deposition mask apparatus including a deposition mask.

Background Art

A display device used in a portable device such as a smart phone and a tablet PC is required to have high fineness, e.g., a pixel density of 500 ppi or more. In addition, there is increasing demand that the portable device is applicable to ultra-high definition (UHD). In this case, the pixel density of a display device is preferably 800 ppi or more.

Among display devices, an organic EL display device draws attention because of its excellent responsibility, low power consumption, and high contrast. A known method for forming pixels of an organic EL display device is a method which uses a deposition mask in which through-holes are formed and arranged in a desired pattern, and forms pixels in the desired pattern. To be specific, a deposition mask is firstly brought into tight contact with a substrate for an organic EL display device, and then the substrate and the deposition mask in tight contact therewith are put into a deposition apparatus so as to conduct a deposition step of depositing an organic material on the substrate. This makes it possible to form pixels including the organic material on the substrate with a pattern corresponding to the through-hole pattern of the deposition mask.

A known method for manufacturing a deposition mask is a method in which through-holes are formed in a metal plate by etching using photolithographic technique. For example, a first resist pattern is firstly formed on a first surface of the metal plate by exposure and development, and a second resist pattern is formed on a second surface of the metal plate by exposure and development. Then, an area of the first surface of the metal plate, which is not covered with the first resist pattern, is etched to form first recesses in the first surface of the metal plate. Thereafter, an area of the second surface of the metal plate, which is not covered with the second resist pattern, is etched to form second recesses in the second surface of the metal plate. At this time, by etching the areas such that each first recess and each second recess communicate with each other, through-holes passing through the metal plate can be formed. A metal plate for preparing a deposition mask can be prepared by, for example, rolling a base metal made of a metal such as an iron alloy containing nickel.

In addition to the above, a method for manufacturing a deposition mask involving a plating process is known as a method for manufacturing a deposition mask. For example, an electrically conductive base material is firstly prepared. Then, a resist pattern is formed on the base material with a predetermined gap. This resist pattern is provided at a position where through-holes of a deposition mask should be formed. Thereafter, plating liquid is supplied to each gap of the resist pattern so as to deposit a metal layer on the base material by an electrolytic plating process. Subsequently, by separating the metal layer from the base material, it is possible to obtain a deposition mask having a plurality of through-holes formed therein.

PRIOR ART

Patent Document

Patent Document 1: Japanese Patent No. 5382259
Patent Document 2: JP 2001-234385 A

SUMMARY

In order to deposit a deposition material in a desired pattern on a substrate with good accuracy, it is preferable that a deposition mask has a small thickness. Meanwhile, when a deposition mask has a small thickness, the strength of a metal plate constituting the deposition mask decreases, plastic deformation is likely to occur on the metal plate during the deposition mask manufacturing step or the use of the deposition mask.

An object of embodiments of the disclosure is to provide a metal plate that can effectively solve the above problems.

Solution to Problem

One embodiment of the disclosure is a metal plate used for manufacturing a deposition mask, wherein the metal plate is made of a rolled steel of an iron alloy containing at least nickel and has a thickness of equal to or less than 30 µm, wherein an average cross-sectional area of crystals grains on a cross section of the metal plate is from 0.5 µm$^2$ to 50 µm$^2$, the cross section having an angle of from −10° to +10° with respect to a plane perpendicular to a rolling direction of the metal plate, and wherein the average cross-sectional area of crystals grains is calculated by analyzing measurement results obtained by an EBSD method, the measuring results being analyzed by an area method under conditions where a portion with a difference in crystal orientation of equal to or more than 5 degrees is recognized as a crystal grain boundary. A total content of nickel and cobalt in the rolled steel may be from 30% to 38% by mass.

One embodiment of the disclosure is a metal plate used for manufacturing a deposition mask, wherein the metal plate is made of a plating film of an iron alloy containing at least nickel and has a thickness equal to or less than 30 µm, wherein an average cross-sectional area of crystals grains on a cross section of the metal plate is from 0.5 µm$^2$ to 50 µm$^2$, the cross section having an angle of from −10° to +10° with respect to a plane perpendicular to a longitudinal direction of the plating film, and wherein the average cross-sectional area of crystals grains is calculated by analyzing measurement results obtained by an EBSD method, the measuring results being analyzed by an area method under conditions where a portion with a difference in crystal orientation of equal to or more than 5 degrees is recognized as a crystal grain boundary. A total content of nickel and cobalt in the plating film may be from 38% to 54% by mass.

The average cross-sectional area of the crystal grains may be equal to or more than 2.0 μm$^2$ in a metal plate according to one embodiment of the disclosure.

The metal plate according to one embodiment of the disclosure may have a thickness of equal to or more than 13 μm.

One embodiment of the disclosure is a deposition mask, having a metal plate and through-holes formed in the metal plate, wherein the metal plate is made of a rolled steel of an iron alloy containing at least nickel and has a thickness of equal to or less than 30 μm, wherein an average cross-sectional area of crystals grains on a cross section of the metal plate is from 0.5 μm$^2$ to 50 μm$^2$, the cross section having an angle of from −10° to +10° with respect to a plane perpendicular to a rolling direction of the metal plate, and wherein the average cross-sectional area of crystals grains is calculated by analyzing measurement results obtained by an EBSD method, the measuring results being analyzed by an area method under conditions where a portion with a difference in crystal orientation of equal to or more than 5 degrees is recognized as a crystal grain boundary. A total content of nickel and cobalt in the rolled steel may be from 30% to 38% by mass.

One embodiment of the disclosure is a deposition mask, having a metal plate and through-holes formed in the metal plate, wherein the metal plate is made of a plating film of an iron alloy containing at least nickel and has a thickness of equal to or less than 30 μm, wherein an average cross-sectional area of crystals grains on a cross section of the metal plate is from 0.5 μm$^2$ to 50 μm$^2$, the cross section having an angle of from −10° to +10° with respect to a plane perpendicular to a longitudinal direction of the plating film, and wherein the average cross-sectional area of crystals grains is calculated by analyzing measurement results obtained by an EBSD method, the measuring results being analyzed by an area method under conditions where a portion with a difference in crystal orientation of equal to or more than 5 degrees is recognized as a crystal grain boundary. A total content of nickel and cobalt in the plating film may be from 38% to 54% by mass.

The average cross-sectional area of the crystal grains may be equal to or more than 2.0 μm$^2$ in a deposition mask according to one embodiment of the disclosure.

The metal plate may have a thickness of equal to or more than 10 μm in the deposition mask according to one embodiment of the disclosure.

One embodiment of the disclosure is a deposition mask apparatus including the aforementioned deposition mask and a frame holding the deposition mask welded thereto.

One embodiment of the disclosure is a method for manufacturing a deposition mask, comprising: a step of preparing the metal plate according to the aforementioned first to sixth aspects; a step of transporting the metal plate along a longitudinal direction; and a step of forming through-holes in the metal plate.

One embodiment of the disclosure is a method for manufacturing a metal plate used for manufacturing a deposition mask, comprising a preparation step of obtaining the metal plate which is made of an iron alloy containing nickel and has a thickness of equal to or less than 30 μm in the form of a rolled steel by rolling, wherein an average cross-sectional area of crystals grains on a cross section of the metal plate is from 0.5 μm$^2$ to 50 μm$^2$, the cross section having an angle of from −10° to +10° with respect to a plane perpendicular to a rolling direction of the rolled steel, and wherein the average cross-sectional area of crystals grains is calculated by analyzing measurement results obtained by an EBSD method, the measuring results being analyzed by an area method under conditions where a portion with a difference in crystal orientation of equal to or more than 5 degrees is recognized as a crystal grain boundary. The preparation step may include a rolling step of rolling a base metal and an annealing step of annealing the base metal obtained by rolling at from 500° C. to 600° C. for 30 to 90 seconds during transport.

One embodiment of the disclosure is a method for manufacturing a metal plate used for manufacturing a deposition mask, comprising a preparation step of obtaining the metal plate which is made of an iron alloy containing at least nickel and has a thickness of equal to or less than 30 μm in the form of plating film by plating wherein an average cross-sectional area of crystals grains on a cross section of the metal plate is from 0.5 μm$^2$ to 50 μm$^2$, the cross section having an angle of from −10° to +10° with respect to a plane perpendicular to a longitudinal direction of the plating film, and wherein the average cross-sectional area of crystals grains is calculated by analyzing measurement results obtained by an EBSD method, the measuring results being analyzed by an area method under conditions where a portion with a difference in crystal orientation of equal to or more than 5 degrees is recognized as a crystal grain boundary. The preparation step may include: a step of forming a plating film on a surface of a drum partially immersed in a plating liquid while rotating the drum; and a step of obtaining the metal plate made of the plating film in the elongated form by removing the plating film from the drum.

Advantageous Effects of Invention

According to embodiments of the disclosure, strength and weldability of a metal plate having a thickness of 30 μm or less can be improved.

BRIEF DESCRIPTION OF THE DRAWINGS

FIG. 24 is a view showing an example of a method for measuring welding strength of a welded portion.

FIG. 25 is a view showing evaluation results for metal plates according to Examples 1 to 16.

DESCRIPTION OF EMBODIMENTS

Figure 1:
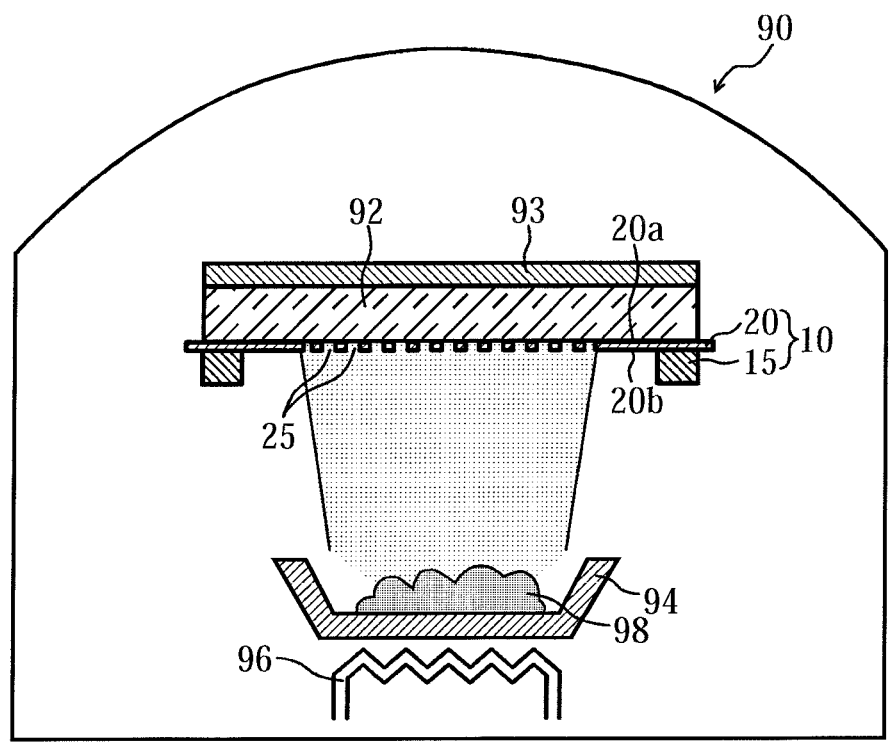
FIG. 1 is a view for illustrating a deposition apparatus including a deposition mask apparatus according to one embodiment of the disclosure.

In the specification and the drawings, unless otherwise specified, the terms "plate", "sheet" and "film" are not differentiated from one another, based only on the difference in terms. For example, the "plate" is a concept including a member that can be referred to as "sheet" or "film". In addition, a "plane (sheet plane, film plane)" indicates a plane corresponding to a planar direction of a plate-like (sheet-like, film-like) member as a target, when the plate-like (sheet-like, film-like) member is seen as a whole in general. In addition, a normal direction used for the plate-like (sheet-like, film-like) member indicates a normal direction with respect to a plane (sheet plane, film plane) of the member. Further, in the specification and the drawings, unless otherwise specified, terms specifying shapes, geometric conditions and their degrees are not limited to their strict definitions, but should be construed to include a range capable of exerting a similar function.

In this specification and the drawings, unless otherwise specified, when a certain structure such as a certain member or a certain area is "above (or below)" or "on the upside (or on the downside)" of another structure such as another member or another area, it includes not only a case in which the certain structure is in direct contact with the other structure, but also a case in which a further structure is disposed between the certain structure and the other structure. In addition, unless otherwise specified, the term upper (or upside or above) and the term lower (or downside or below) are used for explanation, but they can be replaced with each other.

In this specification and the drawings, unless otherwise specified, the same or similar reference numeral is given to the same part and parts having the similar function, and repeated description thereof is sometimes omitted. There is a possibility that a scale dimension differs from an actual one, and that a part of a structure is omitted from the drawings, in the convenience of explanation.

In this specification and the drawings, the embodiment of the disclosure can be combined with other embodiments and modifications as long as no contradiction arises. The other embodiments may be combined and the other embodiments and modifications may be combined as long as no contradiction arises. The modifications can also be combined as long as no contradiction arises.

In this specification and the drawing, unless otherwise specified, when a plurality of steps are disclosed regarding a method such as a manufacturing method, other steps which are not disclosed may be performed between the disclosed steps. The order of the disclosed steps is arbitrary as long as no contradiction arises.

In this specification and the drawings, unless otherwise specified, a numerical range expressed by means of a symbol "-" includes numerical values with the symbol "-" interposed therebetween. For example, a numerical range delimited by the expression "34-38% by mass" is the same as a numerical range delimited by the expression "not less than 34% by mass and not more than 38% by mass".

In one embodiment of this specification, examples related to a deposition mask used for patterning an organic material on a substrate in a desired pattern in manufacturing process of an organic EL display device, and a manufacturing method of the deposition mask are described. However, the embodiment is not limited to this application, and can be applied to a deposition mask used for various purposes.

An embodiment of this disclosure is described in detail with reference to the drawings. The below embodiment is an example of the embodiment of this disclosure, and this disclosure should not be limited to these embodiments.

Firstly, a deposition apparatus 90 for performing a deposition process for depositing a deposition material on an object is explained with reference to FIG. 1. As shown in FIG. 1, the deposition apparatus 90 includes therein a deposition source (e.g., a crucible 94), a heater 96, and a deposition mask apparatus 10. In addition, the deposition apparatus 90 may further include exhaust means to create a vacuum atmosphere inside of the deposition apparatus 90. The crucible 94 accommodates a deposition material 98 such as an organic luminescent material. The heater 96 is configured to heat the crucible 94 to evaporate the deposition material 98 in the vacuum atmosphere. The deposition mask apparatus 10 is placed opposite to the crucible 94.

Hereinafter, the deposition mask apparatus 10 is described. As shown in FIG. 1, the deposition mask apparatus 10 may include a deposition mask 20 and a frame 15 for holding the deposition mask 20. The frame 15 is configured to hold the deposition mask 20 in a taut state in the planar direction in order to prevent the deposition mask 20 from warping. The deposition mask apparatus 10 is disposed in a deposition apparatus 90 such that the deposition mask 20 faces a substrate as an object, onto which the deposition material 98 is to be deposited, for example, an organic EL substrate 92 as shown in FIG. 1. In the following description, among surfaces of the deposition mask 20, the surface on the organic EL substrate 92 side is referred to as a first surface 20a, and the surface opposite to the first surface 20a is referred to as a second surface 20b.

The deposition apparatus 90 may include a magnet 93 disposed on a surface of the organic EL substrate 92, which is opposite to the surface on the deposition mask 20 side, as shown in FIG. 1. By providing the magnet 93, the deposition mask 20 can be attracted to the magnet 93 by magnetic force, and the deposition mask 20 can be brought into close contact with the organic EL substrate 92.

Figure 3:
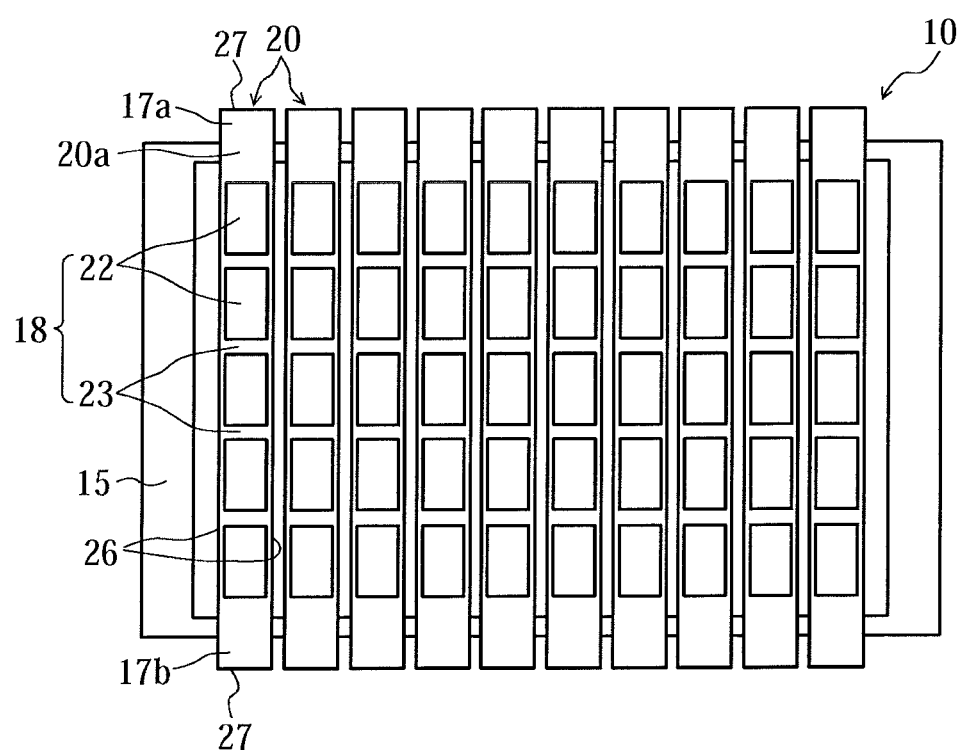
FIG. 3 is a plan view showing a deposition mask apparatus according to one embodiment of the disclosure.

FIG. 3 is a plan view of the deposition mask apparatus 10 when viewed from the first surface 20a side of the deposition mask 20. As shown in FIG. 3, the deposition mask apparatus 10 may include a plurality of deposition masks 20. Each deposition mask 20 may have a pair of long sides 26 and a pair of short sides 27. For example, each deposition mask 20 may have a rectangular shape. Each deposition mask 20 may be fixed via a pair of short sides 27 or a portion in the vicinity thereof to the frame 15 by, for example, welding.

Each deposition mask 20 may include a metallic plate-like base material, in which a plurality of through-holes 25 are formed to penetrate through the deposition mask 20. The deposition material 98, which has been evaporated from the crucible 94 and reached the deposition mask apparatus 10, passes through the through-holes 25 in the deposition mask 20 so as to adhere to the organic EL substrate 92. As a result, a film of the deposition material 98 is formed on the surface of the organic EL substrate 92 in a desired pattern corresponding to the positions of the through-holes 25 of the deposition mask 20.

Figure 2:
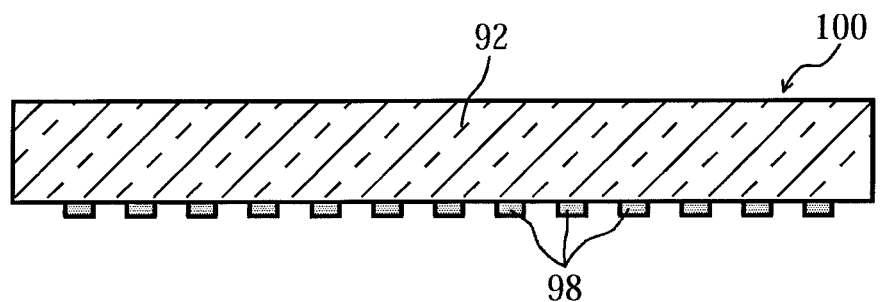
FIG. 2 is a sectional view showing an organic EL display device manufactured using the deposition mask apparatus illustrated in FIG. 1.

FIG. 2 is a sectional view showing an organic EL display device 100 manufactured using the deposition apparatus 90 of FIG. 1. The organic EL display device 100 includes the organic EL substrate 92 and patterned pixels containing the deposition materials 98.

When a color display is desired with a plurality of colors, deposition apparatuses 90 equipped with deposition masks 20 corresponding to the respective colors are prepared, and the organic EL substrate 92 is introduced into each deposition apparatus 90. Accordingly, for example, an organic luminescent material for red color, an organic luminescent material for green color, and an organic luminescent material for blue color can be sequentially deposited on the organic EL substrate 92.

Incidentally, the deposition process is performed inside the deposition apparatus 90 in a high-temperature atmosphere in one case. In this case, during the deposition process, the deposition mask 20, the frame 15, and the organic EL substrate 92, which are held inside the deposition apparatus 90, are also heated. At this time, each of deposition mask 20, the frame 15, and the organic EL substrate 92 develop dimensional change behaviors based on their respective thermal expansion coefficients. In this case, when the thermal expansion coefficients of the deposition mask 20, the frame 15 and the organic EL substrate 92 largely differ from one another, positioning displacement occurs because of the difference in dimensional change.

In order to avoid this problem, the thermal expansion coefficients of the deposition mask 20 and the frame 15 are preferably equivalent to the thermal expansion coefficient of the organic EL substrate 92. For example, when a glass substrate is used as the organic EL substrate 92, an iron alloy containing nickel can be used as a main material of the deposition mask 20 and the frame 15. The iron alloy may further contain cobalt as well as nickel. For example, it is possible to use, as a material for the base material constituting the deposition mask 20, an iron alloy containing nickel and cobalt at a total content of from 30% to 54% by mass in which the cobalt content is from 0% to 6% by mass or less. Concrete examples of an iron alloy containing nickel or nickel and cobalt may be an invar material containing 34% to 38% by mass of nickel, a super invar material containing cobalt in addition to 30% to 34% by mass of nickel, or a low thermal expansion Fe—Ni based plated alloy containing 38% to 54% by mass of nickel.

When the temperatures of the deposition mask 20, frame 15, and organic EL substrate 92 do not reach high temperatures during the deposition process, it is not particularly necessary to make the thermal expansion coefficients of the deposition mask 20 and the frame 15 equivalent to the thermal expansion coefficient of the organic EL substrate 92. In this case, a material other than the aforementioned iron alloy may be used as the material constituting the deposition mask 20. For example, an alloy other than the aforementioned iron alloy containing nickel, such as an iron alloy containing chromium, may be used. As an iron alloy containing chromium, for example, an iron alloy, which is called so-called stainless steel, can be used. In addition, alloys such as a nickel or nickel-cobalt alloy other than iron alloys may be used.

Next, the deposition mask 20 is described in detail. As shown in FIG. 3, the deposition mask 20 may include a pair of ear portions including a pair of short sides 27 of the deposition mask 20 (first ear portion 17a and second ear portion 17b) and an intermediate portion 18 positioned between the pair of ear portions 17a, 17b.

Firstly, ear portions 17a, 17b are described in detail. The ear portions 17a, 17b are portions of the deposition mask 20, which are fixed to the frame 15. In this embodiment, the ear portions 17a, 17b are configured integrally with the intermediate portion 18. In addition, the ear portions 17a, 17b may be formed with a member different from a member for the intermediate portion 18. In this case, the ear portions 17a, 17b are bonded to the intermediate portion 18 by, for example, welding.

(Intermediate Portion)

Next, the intermediate portion 18 is described. The intermediate portion 18 may include at least one effective area 22, in which the through-holes 25 are formed ranging from the first surface 20a to the second surface 20b, and a peripheral area 23 surrounding the effective area 22. The effective area 22 of the deposition mask 20 is an area surfacing the display area of the organic EL substrate 92.

In the example shown in FIG. 3, the intermediate portion 18 includes a plurality of effective areas 22 arranged at predetermined intervals along the long sides 26 of the deposition mask 20. A single effective area 22 corresponds to a single display area of the organic EL display device 100. Therefore, the deposition mask apparatus 10 shown in FIG. 1 enables a multifaceted deposition of the organic EL display device 100. A single effective area 22 may also correspond to a plurality of display areas.

As shown in FIG. 3, each effective area 22 may have an outline of, for example, a substantially quadrangular shape in plan view, more precisely, a substantially rectangular shape in plan view. Although not shown, each effective area 22 can have an outline of a different shape in accordance with the shape of the display area of the organic EL substrate 92. For example, each effective area 22 may have a circular outline.

Figure 4:
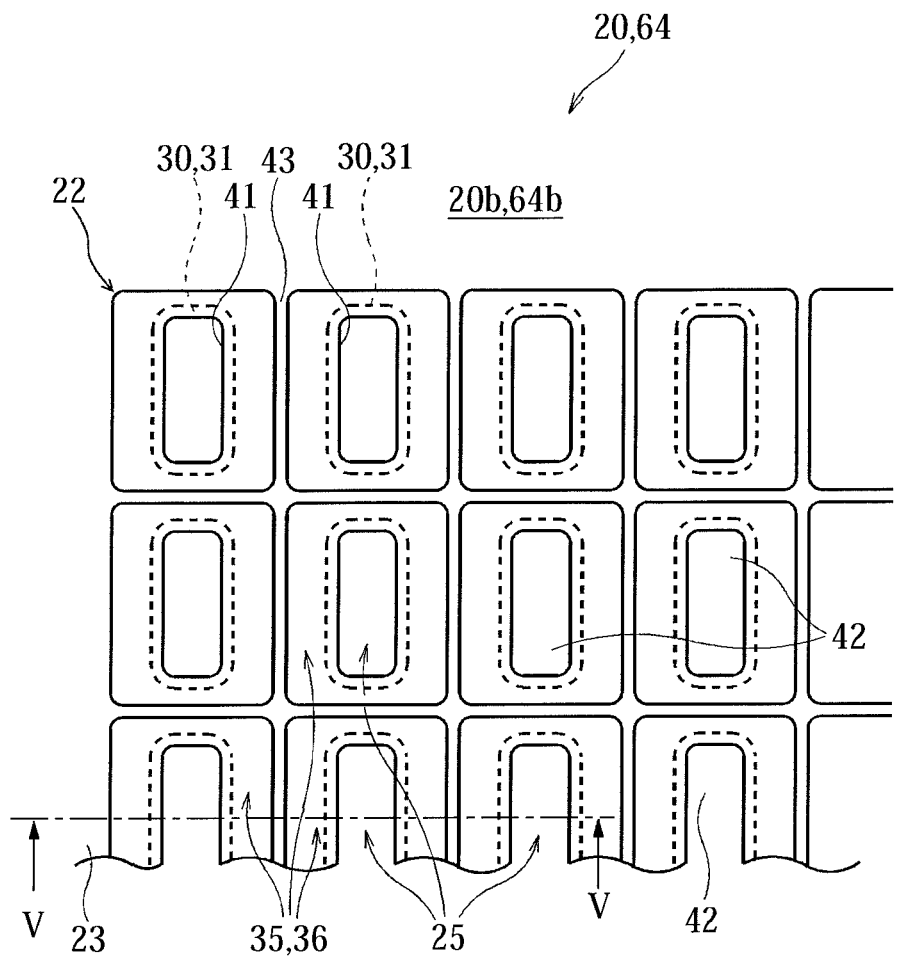
FIG. 4 is a partial plan view showing a part of the effective area of the deposition mask shown in FIG. 3.

Next, the effective area 22 is described in detail. FIG. 4 is a plan view showing the enlarged effective area 22 when viewed from the second surface 20b side of deposition mask 20. As shown in FIG. 4, in the illustrate example, a plurality of the through-holes 25 formed in each effective area 22 are arranged at predetermined pitches along two directions perpendicular to each other.

Figure 5:
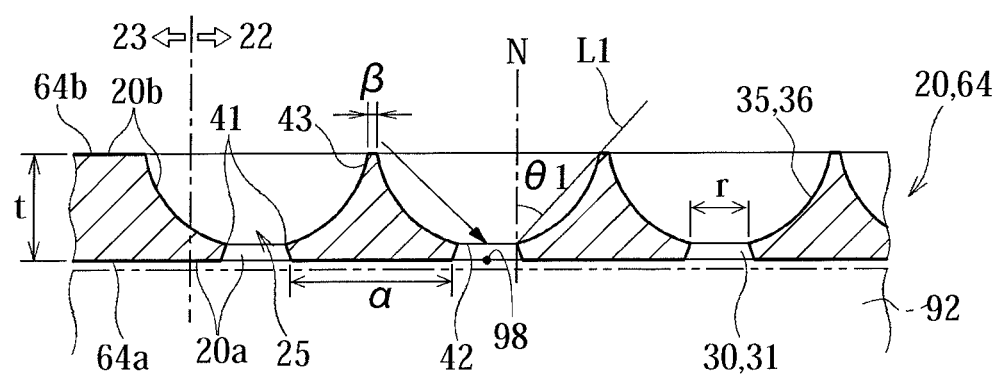
FIG. 5 is a sectional view along the V-V line of FIG. 4.

FIG. 5 is a sectional view along the V-V direction of the effective area 22 of FIG. 4. As shown in FIG. 5, a plurality of the through-holes 25 pass through from the first surface 20a, which is one side along a normal direction N of the deposition mask 20, to the second surface 20b, which is the other side among the normal direction N of the deposition mask 20. In the illustrated example, as described in more detail below, first recesses 30 are formed in the first surface 64a of the metal plate 64, which serves as the one side in the normal direction N of the deposition mask 20, by an etching process, and second recesses 35 are formed in the second surface 64b of the metal plate 64, which serves as the other side in the normal direction N of the deposition mask 20. Each of the first recesses 30 is connected to each of the second recesses 35, so that the second recess 35 and the first recess 30 are formed to communicate with each other. Each through-hole 25 is composed of the second recess 35 and the first recess 30 connected to the second recess 35. As shown in FIGS. 4 and 5, a wall surface 31 of the first recess 30 and a wall surface 36 of the second recess 35 are connected via a circumferential connection portion 41. The connection portion 41 defines a through-portion 42 where an opening area of the through-hole 25 is minimum in plan view of the deposition mask 20.

As shown in FIG. 5, the adjacent two through-holes 25 on the first surface 20a side of the deposition mask 20 are spaced from each other along the first surface 64a of the metal plate 64. The adjacent two second recesses 35 may be spaced from each other along the second surface 64b of the metal plate 64 also on the second surface 20b side of the deposition mask 20. Namely, the second surface 64b of the metal plate 64 may remain between the two adjacent second recesses 35. In the below description, a portion of the effective area 22 of the second surface 64b of the meal plate 64, which is not etched and thus remains, is also referred to as top portion 43. By producing the deposition mask 20 such that such a top portion 43 remains, the deposition mask 20 can have a sufficient strength. Thus, it can be prevented that the deposition mask 20 is damaged during transport, for example. However, when a width β of the top portion 43 is too large, there is a possibility that shadow occurs in the deposition step, which lowers utilization efficiency of the deposition material 98. Thus, the deposition mask 20 is preferably produced such that the width β of the top portion 43 is excessively large. The term "shadow" refers to a phenomenon in which adhesion of a deposition material to a region overlapping with the through-holes of the deposition mask 20 on a deposition object such as the organic EL substrate 92 is inhibited by the second surface 20b and/or the wall surface of the deposition mask 20.

As shown in FIG. 1, the deposition mask apparatus 10 is received in the deposition apparatus 90. In this case, as shown by the two-dot chain lines in FIG. 5, the first surface 20a of the deposition mask 20 is located to face the organic EL substrate 92, and the second surface 20b of the deposition mask 20 is located on the side of the crucible 94 holding the deposition material 98. Thus, the deposition material 98 adheres to the organic EL substrate 92 through the second recess 35 whose opening area gradually decreases. As shown by the arrow in FIG. 5 extending from the second surface 20b toward the first surface 20a, the deposition material 98 not only moves from the crucible 94 toward the organic EL substrate 92 along the normal direction N of the organic EL substrate 92, but also sometimes moves along a direction largely inclined with respect to the normal direction N of the organic EL substrate 92. At this time, when the thickness of the deposition mask 20 is large, the deposition material 98 moving diagonally tends to be stuck on the top portion 43, the wall surface 36 of the second recess 35, or the wall surface 31 of the first recess 30. As a result, the proportion of the deposition material 98 that cannot pass through the through-holes 25 increases. Thus, in order to improve a utilization efficiency of the deposition material 98, it is considered to be preferable that the thickness t of the deposition mask 20 is reduced so that heights of the wall surface 36 of the second recess 35 and the wall surface 31 of the first recess 30 are reduced. Namely, it can be said that it is preferable that a metal plate 64, which has the thickness t as small as possible as long as the strength of the deposition mask 20 is ensured, is used as the metal plate 64 for constituting the deposition mask 20. In consideration of this point, the thickness t of the deposition mask 20 in this embodiment is for example, 30 µm or less, preferably 25 µm or less, more preferably 20 µm or less. The thickness t of the deposition mask 20 may be 18 µm or less or 15 µm or less. Meanwhile, when the thickness of the deposition mask 20 is excessively small, strength of the deposition mask 20 is reduced, which is likely to cause damage or deformation of the deposition mask 20. In consideration of this point, the thickness t of the deposition mask 20 may be 5 µm or more, 7 µm or more, 10 µm or more, 13 µm or more, or 15 µm or more. The thickness t is a thickness of the peripheral area 23, i.e., a thickness of a part of the deposition mask 20 where the first recess 30 and the second recess 35 are not formed. Therefore, the thickness t can be said as a thickness of the metal plate 64.

The range of the thickness t of the deposition mask 20 may be determined based on a combination of any of the plurality of upper limit candidate values described above and any of the plurality of lower limit candidate values described above. For example, the thickness t of the deposition mask 20 may be from 5 µm to 30 µm, from 7 µm to 25 µm, from 10 µm to 20 µm, or from 13 µm to 18 µm. In addition, the range of the thickness t of the deposition mask 20 may be determined based on a combination of any two of the plurality of upper limit candidate values described above. For example, the thickness t of the deposition mask 20 may be from 25 µm to 300 µm. In addition, the range of the thickness t of the deposition mask 20 may be determined based on a combination of any two of the plurality of lower limit candidate values described above. For example, the thickness t of the deposition mask 20 may be from 5 µm to 7 µm.

In FIG. 5, a minimum angle defined by a line L1, which passes the connection portion 41 having the minimum opening area of the through-hole 25 and another given position of the wall surface 36 of the second recess 35, with respect to the normal direction N of the deposition mask 20 is represented by a symbol θ1. In order that the diagonally moving deposition material 98 can be caused to reach the organic EL substrate 92 without being caused to reach the wall surface 36 as much as possible, it is advantageous that the angle θ1 is increased. In order to increase the angle θ1, it is effective to reduce the aforementioned width β of the top portion 43, as well as to reduce the thickness t of the deposition mask 20.

In FIG. 5, the symbol α represents a width of a portion (hereinafter also referred to as "rib portion") of the effective area 22 of the first surface 64a of the metal plate 64, which is not etched and thus remains. A width α of the rib portion and a size r of the through-portion 42 are suitably determined depending on a size of an organic EL display device and its display pixels. For example, the width α of the rib portion is from 5 μm to 40 μm, and the size r of the through-portion 42 is from 10 μm to 60 μm.

The width α of the rib portion may be 10 μm or more, 15 μm or more, or 20 μm or more. In addition, the width α of the rib portion may be 35 μm or less, 30 μm or less, or 25 μm or less. The range of the width α of the rib portion can be determined based on a combination of any of the plurality of upper limit candidate values described above and any of the plurality of lower limit candidate values described above. For example, the width α of the rib portion may be from 10 μm to 35 μm, from 15 μm to 30 μm, or from 20 μm to 25 μm. In addition, the range of the width α of the rib portion may be determined based on a combination of any two of the plurality of upper limit candidate values described above. For example, the width α of the rib portion may be from 35 μm to 40 μm. In addition, the range of the width α of the rib portion may be determined based on a combination of any two of the plurality of lower limit candidate values described above. For example, the width α of the rib portion may be from 5 μm to 10 μm.

The size r of the through-portion 42 may be 15 μm or more, 20 μm or more, 25 μm or more, or 30 μm or more. In addition, the lower limit of the size r of the through-portion 42 may be smaller than 10 μm mentioned above. For example, the size r of the through-portion 42 may be 5 μm or more. In addition, the size r of the through-portion 42 may be 55 μm or less, 50 μm or less, 45 μm or less, 40 μm or less, or 35 μm or less. The range of the size r of the through-portion 42 can be determined based on a combination of any of the plurality of upper limit candidate values described above and any of the plurality of lower limit candidate values described above. For example, the size r of the through-portion 42 may be from 15 μm to 55 μm, from 20 μm to 50 μm, from 25 μm to 45 μm, from 30 μm to 40 μm, or from 30 μm to 35 μm. In addition, the range of the size r of the through-portion 42 may be determined based on a combination of any two of the plurality of upper limit candidate values described above. For example, the size r of the through-portion 42 may be from 55 μm to 60 μm. In addition, the range of the size r of the through-portion 42 may be determined based on a combination of any two of the plurality of lower limit candidate values described above. For example, the size r of the through-portion 42 may be from 5 μm to 10 μm.

FIGS. 4 and 5 show an example in which the second surface 64b of the metal plate 64 remains between the two adjacent second recesses 35. However, the disclosure is not limited thereto. Although not shown, etching may be performed such that two adjacent second recesses 35 are connected to each other. Namely, there may be a part where no second surface 64b of the metal plate 64 remains between two adjacent second recesses 35.

Next, a method for manufacturing a deposition mask 20 is described.

Firstly, manufacturing method for a metal plate used for manufacturing a deposition mask is described. In this embodiment, an example in which a metal plate is made of a rolled steel of an iron alloy containing nickel is described. The rolled steel may have a thickness of 30 μm or less. In addition, the rolled steel may contain 30% to 38% by mass of nickel, 0% to 6% by mass of cobalt, balancing iron, and unavoidable impurities.

Iron, nickel, and other starting materials are firstly prepared. For example, starting materials are prepared such that the proportions of iron and nickel with respect to the total proportion of starting materials are about 64% by weight and about 36% by weight, respectively. Next, after each starting material is disrupted if appropriate, each starting material is subject to the melting step of performing melting in a melting furnace. For example, each starting material is melted using gas discharge such as arc discharge so as to be mixed. Thus, a base metal for a metal plate can be obtained.

The melting temperature is, for example, 1500° C. or more, although it is set depending on starting materials. The melting step may include a step of introducing aluminum, manganese, silicon, or the like into a melting furnace for deacidification, dehydration, or denitrification. In addition, the melting step may be performed in an inert gas atmosphere of argon or the like at a pressure lower than atmospheric pressure.

After the base metal is taken out from the melting furnace, there may be performed a grinding step of grinding off the surface of the base metal. This enables removal of an oxide coating such as scale. A specific grinding method is not particularly limited. However, it is possible to adopt a so-called grinding method in which the surface of a base metal is ground by rotating a grinding wheel or a so-called pushing method in which a base metal is pushed into a cutting tool to grind the surface of the base metal. The grinding step may be performed such that the base metal has a uniform thickness.

Figure 6:
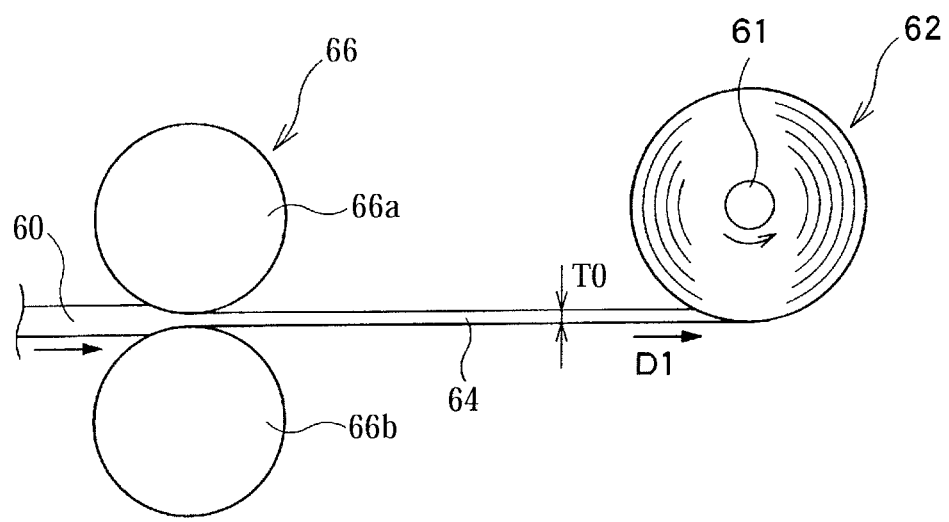
FIG. 6 is a view showing a step of obtaining a metal plate having a desired thickness by rolling a base metal.

Next, as shown in FIG. 6, a rolling step of rolling a base metal 60 made of an iron alloy containing nickel is performed. For example, the base metal 60 is transported toward a rolling apparatus 66 including a pair of reduction rolls (work rolls) 66a, 66b while tension is applied in the direction of arrow D1. The base metal 60 having reached between the pair of reduction rolls 66a and 66b is rolled by the pair of reduction rolls 66a and 66b. Thus, a metal plate 64 having a predetermined thickness can be obtained. As shown in FIG. 6, a winding body 62 may be formed by winding the metal plate 64 around the core 61.

FIG. 6 merely shows the rolling step schematically, and a concrete structure and procedure for performing the rolling step are not specifically limited. For example, the rolling step may include a hot rolling step of processing the base metal at a temperature not less than a recrystallization temperature of the iron alloy constituting the base metal 60, and a cold rolling step of processing the base metal at a temperature not more than the recrystallization temperature of the iron alloy. In addition, an orientation along which the base metal 60 and the metal plate 64 pass through between the reduction rolls 66a and 66b is not limited to one direction. For example, in FIGS. 6 and 7, the base metal 60 and the metal plate 64 may be gradually rolled by repeatedly passing the base metal 60 and the metal plate 64 through between the pair of reduction rolls 66a and 66b in an orientation from the left side to the right side in a sheet plane, and in an orientation from the right side to the left side in the sheet plane.

In the rolling step, by adjusting a rolling reduction, the size of crystal grains contained in the metal plate 64 can be adjusted. For example, by increasing a rolling reduction, the size of crystal grains contained in the metal plate 64 can be reduced. When reducing the size of crystal grains, it is preferable to set a rolling reduction to a maximum. In addition, by reducing a rolling reduction, the size of crystal grains contained in the metal plate 64 can be increased.

A rolling reduction is calculated by the following formula.

Rolling reduction(%)=(($T1-T2$)/$T1$)×100

$T1$ represents a thickness of the metal plate 64 before the rolling step is performed, and $T2$ represents a thickness of the metal plate 64 after the rolling step was performed.

A rolling reduction of the metal plate 64 in the rolling step is preferably 70% or more. Thus, the average cross-sectional area of crystal grains of the metal plate 64 can be adjusted to 50 μm² or less as described later. The rolling reduction of the metal plate 64 in the rolling step may be 75% or more, 80% or more, or 85% or more. In addition, a rolling reduction of the metal plate 64 of the rolling step is preferably 95% or less. Thus, the average cross-sectional area of crystal grains of the metal plate 64 can be adjusted to 50 μm² or less as described later. The rolling reduction of the metal plate 64 in the rolling step may be 90% or less or 85% or less.

The range of rolling reduction of the metal plate 64 in the rolling step may be determined based on a combination of any of a plurality of upper limit candidate values and any of a plurality of lower limit candidate values. For example, the rolling reduction may be from 70% to 95%, from 75% to 90%, or from 80% to 85%. In addition, the range of rolling reduction of the metal plate 64 in the rolling step may be determined based on a combination of any two of a plurality of upper limit candidate values. For example, the rolling reduction may be from 90% to 95%. The range of rolling reduction of the metal plate 64 in the rolling step may be determined based on a combination of any two of a plurality of lower limit candidate values. For example, the rolling reduction may be from 70% to 75%.

In the rolling step, a rolling speed, which means a transport speed of the metal plate 64, may be adjusted. For example, when the rolling speed increases, the amount of rolling oil caught between the metal plate 64 and reduction rolls 66a and 66b increases. This makes it possible to suppress the formation of oil pits on the surface of the metal plate 64. By adjusting the transport speed of the metal plate 64 as described above, it is possible to control, for example, the density of oil pits on the surface of the metal plate 64. The rolling speed may be 50 m/minute or more, 70 m/minute or more, or 100 m/minute or more. In addition, the rolling speed is preferably 200 m/minute or less. The rolling speed may be 150 m/minute or less, 100 m/minute or less, or 80 m/minute or less.

The rolling speed may be determined based on a combination of any of a plurality of upper limit candidate values and any of a plurality of lower limit candidate values. For example, the rolling speed may be from 30 m/minute to 200 m/minute or from 50 m/minute to 150 m/minute. In addition, the range of the rolling speed may be determined based on a combination of any two of a plurality of upper limit candidate values. For example, the rolling speed may be from 150 m/minute to 200 m/minute or from 100 m/minute to 150 m/minute. The range of the rolling speed may be determined based on a combination of any two of a plurality of lower limit candidate values. For example, the range of the rolling speed may be from 30 m/minute to 50 m/minute or from 50 m/minute to 70 m/minute. The rolling speed is preferably from 30 m/minute to 200 m/minute, more preferably from 30 m/minute to 150 m/minute, still more preferably from 30 m/minute to 100 m/minute, yet more preferably from 30 m/minute to 80 m/minute.

In addition, the diameter of the reduction roll may be adjusted. For example, when the diameter of the reduction roll is increased, oil pits formed on the surface of the metal plate 64 increase. By adjusting the diameter of the reduction roll as described above, it is possible to control, for example, the density of oil pits on the surface of the metal plate 64. The diameter of the reduction roll is preferably 28 mm or more. The diameter of the reduction roll may be 40 mm or more or 50 mm or more. In addition, the diameter of the reduction roll is preferably 150 mm or less. The diameter of the reduction roll may be 120 mm or less, 100 mm, or 80 mm or less.

The range of the diameter of the reduction roll may be determined based on a combination of any of a plurality of upper limit candidate values and any of a plurality of lower limit candidate values. For example, the diameter of the reduction roll may be from 28 mm to 150 mm or from 40 mm to 120 mm or less. In addition, the range of the diameter of the reduction roll may be determined based on a combination of any two of a plurality of upper limit candidate values. For example, the diameter of the reduction roll may be from 120 mm to 150 mm. The range of the diameter of the reduction roll may be determined based on a combination of any two of a plurality of lower limit candidate values. For example, the diameter of the reduction roll may be from 28 mm to 40 mm. The diameter of the reduction roll is preferably from 28 mm to 150 mm, more preferably from 40 mm to 120 mm, still more preferably from 50 mm to 100 mm or less, yet more preferably from 50 mm to 80 mm or less.

In addition, in the rolling step, the pressure of a rolling actuator may be adjusted to adjust the shape of the metal plate 64. In addition to reduction rolls (work rolls) 66a and 66b, the shape of a backup roll may be adjusted as appropriate, and the position of the backup roll may be adjusted in the plate width direction as appropriate.

In addition, in the cold rolling step, a coolant such as kerosene or neat oil may be supplied between the base metal 60 and the reduction rolls 66a and 66b. This makes it possible to control the temperature of the base metal.

In addition, by selecting a coolant as appropriate, the number, area, etc. of oil pits and rolling lines formed on the surface of the metal plate 64 can be controlled. For example, neat oil can be used as a coolant. Neat oil is characterized in that its viscosity is unlikely to increase during rolling. Therefore, by using neat oil as a coolant, the amount of the coolant caught between the metal plate 64 and reduction rolls 66a and 66b can be reduced. This makes it possible to suppress the formation of oil pits on the surface of the metal plate 64.

In addition, by selecting surface roughness of the reduction roll as appropriate, the number, area, etc. of oil pits and rolling lines formed on the surface of the metal plate 64 can be controlled. For example, by reducing the degree of surface roughness Ra of the reduction roll, it is possible to suppress the formation of rolling lines on the surface of the metal plate 64. The degree of surface roughness Ra of the reduction roll is preferably 0.2 μm or less. The degree of surface roughness Ra of the reduction roll may be 0.15 μm or less, 0.1 μm or less, or 0.05 μm or less. The degree of surface roughness Rz of the reduction roll is preferably 2.0 μm or less. The degree of surface roughness Rx of the reduction roll may be 1.5 μm or less, 1.0 μm or less, or 0.5 μm or less. In addition, the degree of surface roughness Rz of the reduction roll is preferably 2.0 μm or less. The degree of surface roughness Rz of the reduction roll may be 1.5 μm or less, 1.0 μm or less, or 0.5 μm or less. The degrees of surface roughness Ra, Rz are measured in accordance with JIS B 0601: 2013.

In addition, there may be performed an analysis step of analyzing quality and characteristics of the base metal 60 or metal plate 64 before or after the rolling step or between rolling steps. For example, by irradiating the base material 60 or metal plate 64 with fluorescent X-ray, the composition thereof may be analyzed. It is also possible to measure the thermal expansion of the base metal 60 or metal plate 64 by thermomechanical analysis (TMA).

(Annealing Step)

Figure 7:
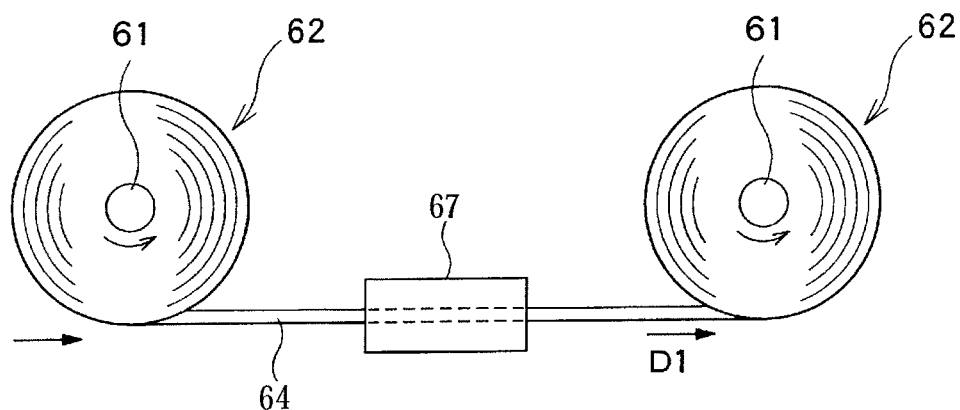
FIG. 7 is a view showing a step of annealing the metal plate obtained by rolling.

After that, in order to remove a remaining stress accumulated by rolling in the metal plate 64, as shown in FIG. 7, an annealing step may be performed to anneal the metal plate 64 by using an annealing apparatus 67. As shown in FIG. 7, the annealing step may be performed while the metal plate 64 is being pulled in the transport direction (longitudinal direction). Namely, the annealing step may be performed as a continuous annealing process while the metal plate is being transported, instead of a batch-type annealing process. In this case, it is preferable to set the temperature or transport speed so as to suppress deformation such as buckling failure of the metal plate 64. By performing the annealing step, it is possible to obtain the metal plate 64 from which the remaining strain is removed to a certain extent. In addition, FIG. 7 shows an example of horizontally transporting the metal plate 64 in the annealing step. However, not limited thereto, it is also possible to transport the metal plate 64 in a different direction such as a vertical direction in the annealing step.

Conditions in the annealing step can be determined as appropriate in accordance with the thickness or rolling reduction of the metal plate 64. For example, the annealing step is performed at from 500° C. to 600° C. for from 30 to 90 seconds. The aforementioned number of seconds represents the time required for the metal plate 64 to pass through a space adjusted to the predetermined temperature in the annealing apparatus 67. The temperature in the annealing step may be determined such that the metal plate 64 is not softened.

The lower limit of the temperature in the annealing step may be lower than 500° C. described above. For example, the temperature in the annealing step may be 400° C. or more or 450° C. or more. In addition, the upper limit of the temperature in the annealing step may be higher than 600° C. described above. For example, the temperature in the annealing step may be 700° C. or less or 650° C. or less. The range of the temperature in the annealing step can be determined based on a combination of any of the plurality of upper limit candidate values described above and any of the plurality of lower limit candidate values described above. For example, the temperature in the annealing step may be from 400° C. to 700° C. or from 450° C. to 650° C. In addition, the range of the temperature in the annealing step may be determined based on a combination of any two of the plurality of upper limit candidate values described above. For example, the temperature in the annealing step may be from 650° C. to 700° C. In addition, the range of the temperature in the annealing step may be determined based on a combination of any two of the plurality of lower limit candidate values described above. For example, the temperature in the annealing step may be from 400° C. to 450° C.

A period of time for the annealing step may be 40 seconds or more or 50 seconds or more. The lower limit of the period of time for the annealing step may be shorter than 30 seconds described above. For example, the period of time for the annealing step may be 10 seconds or more or 20 seconds or more. The period of time for the annealing step may be 80 seconds or less, 70 seconds or less, or 60 seconds or less. The upper limit of the period of time for the annealing step may be longer than 90 seconds described above. For example, the period of time for the annealing step may be 100 seconds or less. The range of the period of time for the annealing step can be determined based on a combination of any of the plurality of upper limit candidate values described above and any of the plurality of lower limit candidate values described above. For example, the period of time for the annealing step may be from 10 seconds to 100 seconds, from 20 seconds to 90 seconds, from 30 seconds to 80 seconds, from 40 seconds to 70 seconds, or from 50 seconds to 60 seconds. In addition, the range of the period of time for the annealing step may be determined based on a combination of any two of the plurality of upper limit candidate values described above. For example, the period of time for the annealing step may be from 90 seconds to 100 seconds. In addition, the range of the period of time for the annealing step may be determined based on a combination of any two of the plurality of lower limit candidate values described above. For example, the period of time for the annealing step may be from 10 seconds to 20 seconds.

The period of time for the annealing step may be determined depending on a temperature of the annealing step. For example, when a temperature of the annealing step is high, crystal grains grow faster. Thus, when the period of time for the annealing step is too long, the average cross-sectional area of crystal grains is likely to exceed a below-described second threshold such as 50 μm$^2$. In consideration of this point, an upper limit of the period of time for the annealing step may be determined depending on a temperature of the annealing step, such that the average cross-sectional area of crystal grains does not exceed the second threshold. Upper limit examples of the period of time for the annealing step are as follows.

more than 350° C. and equal to or less than 400° C.: equal to or less than 12 hours more than 400° C. and equal to or less than 450° C.: equal to or less than 30 minutes more than 450° C. and equal to or less than 500° C.: equal to or less than 10 minutes more than 500° C. and equal to or less than 550° C.: equal to or less than 5 minutes more than 550° C. and equal to or less than 600° C.: equal to or less than 3 minutes more than 600° C. and equal to or less than 650° C.: equal to or less than 1 minutes The aforementioned annealing step is preferably performed in an irreducible atmosphere or an inert gas atmosphere. The irreducible atmosphere herein means an atmosphere free of reducing gas such as hydrogen. The expression "free of reducing gas" means that a concentration of reducing gas such as hydrogen is 10% or less. In the annealing step, the concentration of reducing gas may be 8% or less, 6% or less, 4% or less, 2% or less, or 1% or less. In addition, the inert gas atmosphere means an atmosphere where inert gas such as argon gas, helium gas, or nitrogen gas exists at a concentration of 90% or more. In the annealing step, the concentration of inert gas may be 92% or more, 94% or more, 96% or more, 98% or more, or 99% or more. By performing the annealing step in the irreducible atmosphere or the inert gas atmosphere, it can be prevented that a nickel compound such as nickel hydroxide is generated on a surface layer of the metal plate 64. The annealing apparatus 67 may have a mechanism for monitoring the inert gas concentration or a mechanism for adjusting the inert gas concentration.

Prior to the annealing step, a washing step for washing the metal plate 64 may be performed. This makes it possible to prevent a foreign object from adhering a surface of the metal plate 64 in the annealing step. As a washing solution for washing, for example, a hydrocarbon-based solution can be used.

FIG. 7 shows the example in which the annealing step is performed while the metal plate 64 is being pulled in the longitudinal direction. However, not limited thereto, the annealing step may be performed in a state where the metal plate 64 is wound around the core 61. Namely, the batch-type annealing process may be performed. When the annealing step is performed while the metal plate 64 is wound around the core 61, the metal plate 64 may have a warping tendency corresponding to a winding diameter of the winding body 62. Thus, depending on a winding diameter of the winding body 62 and/or a material forming the base metal 60, it is advantageous to perform the annealing step while the metal plate 64 is being pulled in the longitudinal direction.

After that, there may be performed a slitting step of slitting both ends of the metal plate 64, which is obtained by the rolling step, in the width direction thereof such that the width of the metal plate 64 is in a specific range. The slitting step is performed to remove a crack that may be generated on both ends of the metal plate 64 because of rolling. Due to the slitting step, it can be prevented that a breakage phenomenon of the metal plate 64, which is so-called plate incision, occurs from the crack as a starting point.

The width of a portion to be cut off in the slitting step may be adjusted such that the shape of the metal plate 64 after the slitting step becomes symmetrical in the width direction. In addition, the slitting step may be performed before the aforementioned annealing step The elongated metal plate 64 having a predetermined thickness may be made by repeating at least two steps among the rolling step, the slitting step, and the annealing step a plurality of times.

After the annealing step, a crystal grain inspection step of inspecting the size of crystal grains on a cross section of the metal plate 64 is performed. Specifically, it is inspected whether or not the average cross-sectional area of crystal grains is between a first threshold and a second threshold. The background of performing such inspection is explained below.

As a result of intensive studies, the present inventors found that when the thickness of the metal plate 64 decreases, a specific deformed portion is likely to be formed on the metal plate 64 or the deposition mask 20 manufactured from the metal plate 64. The deformed portion is, for example, a localized protrusion or recess. The deformed portion is formed when, for example, the metal plate 64 is transported in the step of manufacturing the deposition mask 20 or the deposition mask 20 manufactured from the metal plate 64 is handled. As the thickness of the metal plate 64 decreases, the deformed portion tends to be formed. For example, the deformed portion tends to be formed when the thickness of the metal plate 64 is 30 μm or less, more likely when the thickness is 25 μm or less, and still more likely when the thickness is 20 μm or less.

The cause that deformation is likely to occur when the thickness of the metal plate 64 is small is considered to be a decrease in the strength of the metal plate 64. Meanwhile, also when the thickness of the metal plate 64 is small, a possible method for ensuring the strength of the metal plate 64 is considered to be reducing the size of crystal grains of the metal plate 64.

The indicator of crystal grain size can be the size, cross-sectional area, volume, etc. of a crystal grain. In this regard, as a result of intensive studies, the inventors found that as a technique for quantitatively determining the size of crystal grains in a metal plate 64 having a thickness of 30 μm or less, a method for calculating the average cross-sectional area of crystal grains based on an electron backscatter diffraction patterns method (hereinafter also referred to as an EBSD method) is excellent in terms of precision or the like. Therefore, in this embodiment, inspecting whether or not the average cross-sectional area of crystal grains in the metal plate 64 is the second threshold or less is suggested. The second threshold is determined depending on the strength required for the metal plate 64, which is, for example, 50 μm$^2$. The second threshold may be 45 μm$^2$, 40 μm$^2$, 35 μm$^2$, 30 μm$^2$, 25 μm$^2$, or 20 μm$^2$. When the thickness of the metal plate 64 is smaller, a smaller second threshold may be employed. For example, when the thickness of the metal plate 64 is equal to or less than 20 μm, for example, less than 20 μm, or equal to or less than 15 μm, the second threshold may be 20 μm$^2$, 15 μm$^2$, or 10 μm$^2$, for example. The measurement method by the EBSD method will be described in detail later.

Meanwhile, as a result of intensive studies, the inventors found that when the size of crystal grains in the metal plate 64 is excessively small, weldability of the metal plate 64 is reduced. For example, it was found that when welding a deposition mask 20 manufactured from a metal plate 64 to a frame 15, cracks tend to be formed on the surface of the metal plate 64. In view of this, in this embodiment, inspecting whether or not the average cross-sectional area of crystal grains in the metal plate 64 is the first threshold or less is suggested. The first threshold is determined depending on weldability required for the metal plate 64, which is, for example, 0.5 μm$^2$. The first threshold may be 2 μm$^2$, 5 μm$^2$, 10 μm$^2$, 15 μm$^2$, or 20 μm$^2$.

Types of the average cross-sectional area may be the below-described area average cross-sectional area and the number average cross-sectional area. The average cross-sectional area whose preferable range is determined by the aforementioned first threshold and the second threshold is the area average cross-sectional area. In the below description, unless otherwise specified the "average cross-sectional area" means the "area average cross-sectional area".

In the case where the number average cross-sectional area is employed as the number average cross-sectional area, in the metal plate 64 having a thickness of equal to or less than 30 μm, the second threshold may be 3.2 μm$^2$, 3.0 μm$^2$, 2.5 μm$^2$, 2.0 μm$^2$, 1.8 μm$^2$, 1.6 μm$^2$, or 1.4 μm$^2$, for example. When the thickness of the metal plate 64 is equal to or less than 20 μm, for example, less than 20 μm, or equal to or less than 15 μm, the second threshold may be 1.6 μm$^2$, 1.4 μm$^2$, 1.2 μm$^2$, or 1.0 μm$^2$, for example. The first threshold may be 0.2 μm$^2$, 0.4 μm$^2$, 0.6 μm$^2$, 0.8 μm$^2$, 1.0 μm$^2$, or 1.2 μm$^2$, for example.

In the inspection step, for example, a metal plate 64 for which the average cross-sectional area of crystal grains is from 0.5 μm² to 50 μm² is judged as "Passed." In addition, a metal plate 64 for which the average cross-sectional area of crystal grains is less than 0.5 μm² or more than 50 μm² is judged as "Failed."

The range of the average cross-sectional area of crystal grains in the metal plate 64 which is judged as "Passed" in the inspection step may be determined based on a combination of any of the aforementioned plurality of second threshold candidates for specifying the upper limit and any of the aforementioned plurality of first threshold candidates for specifying the lower limit. For example, the average cross-sectional area of crystal grains in the metal plate 64 which is judged as "Passed," i.e., the selected metal plate 64, may be from 2 μm² to 45 μm², from 5 μm² to 40 μm², from 10 μm² to 35 μm², from 15 μm² to 30 μm², or from 20 μm² to 25 μm². In addition, the average cross-sectional area of crystal grains in the selected metal plate 64 may be determined based on a combination of any two of the aforementioned plurality of second threshold candidates for specifying the upper limit. For example, the average cross-sectional area of crystal grains in the selected metal plate 64 may be from 45 μm² to 50 μm². In addition, the range of the average cross-sectional area of crystal grains in the selected metal plate 64 may be determined based on a combination of any two of the aforementioned plurality of first threshold candidates for specifying the lower limit. For example, the average cross-sectional area of crystal grains in the selected metal plate 64 may be from 0.5 μm² to 2 μm².

Figure 8:
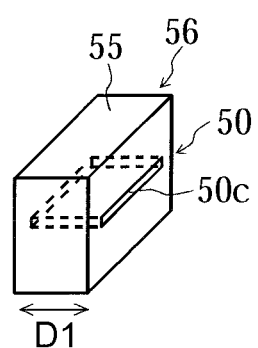
FIG. 8 is a view showing a sample including a test piece extracted from the metal plate.

The measurement method according to the EBSD method is described below with reference to FIGS. 8 to 10. The EBSD method is a method for analyzing crystal grains based on an electron beam diffraction pattern (hereinafter also referred to as "EBSD pattern") obtained when irradiating a sample with an electron beam from a direction that is largely inclined to the surface of the sample by a scanning electron microscope (hereinafter also referred to as "SEM") or the like. As a measurement apparatus, for example, a combination of a Schottky field emission scanning electron microscope and an EBSD detector can be used. As an EBSD detector, for example, an orientation imaging microscopy (OIM) detector manufactured by TSL Solutions can be used.

Upon measurement by the EBSD method, firstly, the metal plate 64 is cut in a direction perpendicular to the transport direction D1 (hereinafter also referred to as "rolling direction") of the metal plate 64 in the rolling step, thereby preparing a test piece 50. The rolling direction D1 is a direction of the extension of linear rolling marks which are confirmed when observing a glossy surface of the metal plate 64 by a metallographic microscope. As a cutting tool, for example, a razor for trimming can be used. The thickness of the test piece 50 is equivalent to the thickness of the metal plate 64. Next, the test piece 50 is sealed with a resin. For example, an epoxy resin is used as the resin. The resin thickness is, for example, 1 mm. Subsequently, the test piece is cut together with the resin using a razor for trimming along a direction perpendicular to the rolling direction D1 and also perpendicular to the planar direction of the test piece. Thus, a cross section 50c of the test piece of the metal plate 64 is exposed from the resin. By doing so, as shown in FIG. 8, it is possible to obtain a sample 56 including the test piece 50, the cross section 50c for measurement of which is exposed from the resin 55. The sample 56 is configured such that the cross section 50c has an angle of from −10° to +10° with respect to a plane orthogonal to the rolling direction D1 of the metal plate 64.

After the cross section 50c for measurement is exposed from the resin 55, the cross section 50c of the test piece 50 may be trimmed using a microtome. Upon trimming, for example, in order to reduce mechanical strain of the cross section 50c of the test piece 50, the test piece 50 is cut by a microtome together with the resin 55 sealing the test piece 50 for a length of about 1 mm in a direction perpendicular to the cross section 50c of the test piece 50. Next, a broad argon ion beam is irradiated in the direction perpendicular to the cross section 50c of the test piece 50 using an ion milling apparatus. Specifically, in a state in which a shielding plate is placed on the test piece 50, and the test piece 50 is allowed to slightly protrude from the shielding plate, the test piece 50 is subject to forming by irradiating accelerated argon ions from the shielding plate side to the test piece 50, thereby obtaining a cross section 50c to be observed. In this case, a cross section 50c having a planar direction parallel to the argon ion irradiation direction is obtained. These operations are intended to precisely expose the cross section 50c of the test piece 50 so as to minimize mechanical destruction of the crystal structure occurring in the previous process. Here, the "perpendicular direction" may not be a direction that defines exactly 90 degrees with respect to the plane or direction of the object, and it may have an error of about 10 degrees. For example, the direction perpendicular to the rolling direction D1 is a direction that defines 80 to 100 degrees with respect to the rolling direction D1. In addition, the direction perpendicular to the surface is a direction that defines 80 to 100 degrees with respect to the surface.

Next, the cross section 50c of the test piece 50 of the sample 56 is irradiated with an electron beam E emitted from an objective lens 57 of a Schottky field emission scanning electron microscope. In addition, an EBSD pattern generated from the test piece 50 is detected using an EBSD detector 58.

In one example, the conditions of a scanning electron microscope used in the EBSD method are as follows.

Observation magnification: 2000 times (The observation magnification standard at the time of photography is Polaroid 545.)

Acceleration voltage: 15 kV

Working distance: 15 mm

Inclined angle of sample: 70 degrees

Figure 9:
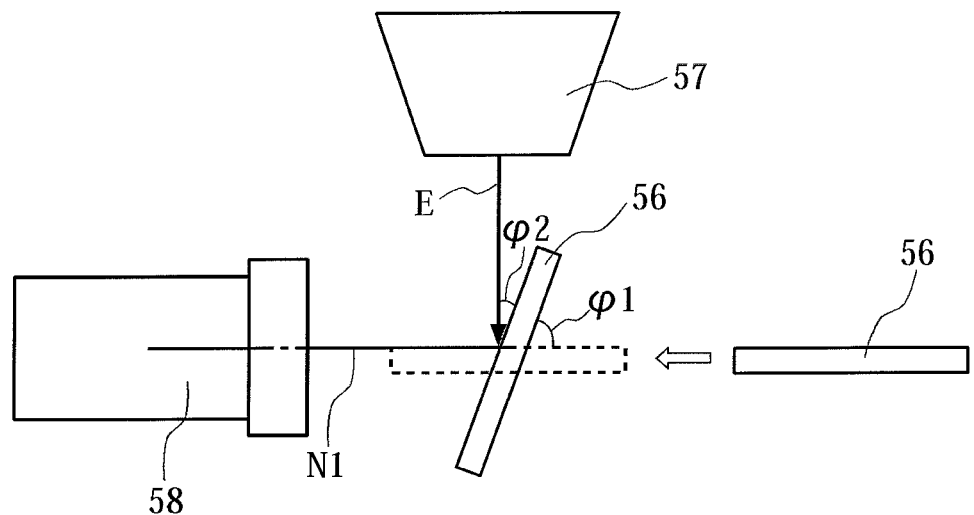
FIG. 9 is a view showing an example of a step of adjusting the inclined angle of the sample including a test piece.
Figure 10:
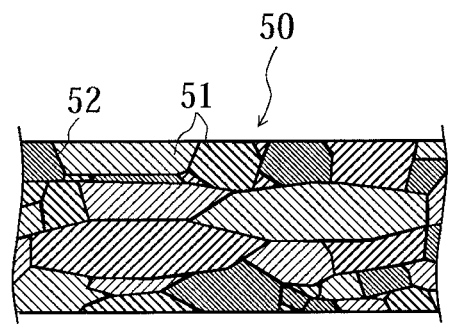
FIG. 10 is a view showing an example of crystal grains on a cross section of a test piece analyzed based on measurement results of the EBSD method.

FIG. 9 is a view showing an example of a step of adjusting the inclined angle of a sample 56 including a test piece 50. The sample 56 including the test piece 50 is firstly fixed to a sample base with the surface (the observation surface or measurement surface) of the sample 56 on which the test piece 50 is exposed facing up. The sample 56 is inserted into a scanning electron microscope, and then, moved directly below the objective lens 57. Next, the sample 56 is rotated by an angle φ1 toward the EBSD detector 58 about the intersection of the electron beam E emitted from the objective lens 57 and the normal line N1 of the EBSD detector 58. The angle φ1 corresponds to the aforementioned inclined angle of the sample, and is, for example, 70 degrees. In this case, an angle φ2 defined by the electron beam E incident on the sample 56 from the objective lens 57 with respect to the surface of the sample 56 is 20 degrees.

Next, the measurement results obtained by the EBSD method, which are EBSD patterns, are analyzed so as to calculate the average cross-sectional area of crystal grains 51 that appear on the cross section 50c of the test piece 50. In one example, the conditions of crystal analysis by the EBSD method are as follows.

Step size: 70 nm

Analysis Conditions:

Analysis is conducted as described below using crystal orientation analysis software OIM (Ver. 7.3) manufactured by TSL Solutions.

When the average cross-sectional area of crystal grains is large, the observation magnification in SEM is designated as the first magnification. For example, when the average cross-sectional area of crystal grains is 2 $\mu m^2$ or more, the observation magnification in SEM is designated as the first magnification. The first magnification is, for example, 2000 times. In addition, when the number of crystal grains that appear in the measurement area to be analyzed is less than 1000, an image in which 1000 or more crystal grains appear may be generated by acquiring an image at a plurality of positions of a cross section of the metal plate 64 while shifting the measurement target area and connecting the obtained plurality of images. At this time, the area from the center to both ends of the thickness direction of the test piece 50 of the metal plate 64 is designated as the measurement area, and the area where the resin is attached to the cross section 50c or the area where the acid-resistant film is present is excluded from the measurement area.

When the average cross-sectional area of crystal grains is small, the observation magnification in SEM is designated as the second magnification higher than the first magnification. For example, when the average cross-sectional area of crystal grains is less than 2 $\mu m^2$, the observation magnification in SEM is designated as the second magnification. The second magnification is, for example, 5000 times. If necessary, also in this case, an image in which 1000 or more crystal grains appear may be generated by connecting the obtained plurality of images.

Analysis is performed by excluding data for which the confidence index (CI value) defined by crystal orientation analysis software OIM (Ver. 7.3) manufactured by TSL Solutions is less than a specified value. For example, data with a CI value of 0.15 or less are excluded. This makes it possible to eliminate the effects of the resin used in pretreatment which is present on the front and back surfaces of the sample 56 and/or the crystal or amorphous grain boundaries present in the cross section of the sample 56.

According to this embodiment, by using the EBSD method, it is possible to obtain accurate information on the size of crystal grains in the metal plate 64. Therefore, the step of inspecting the metal plate 64 can be performed with high accuracy.

Figure 27:
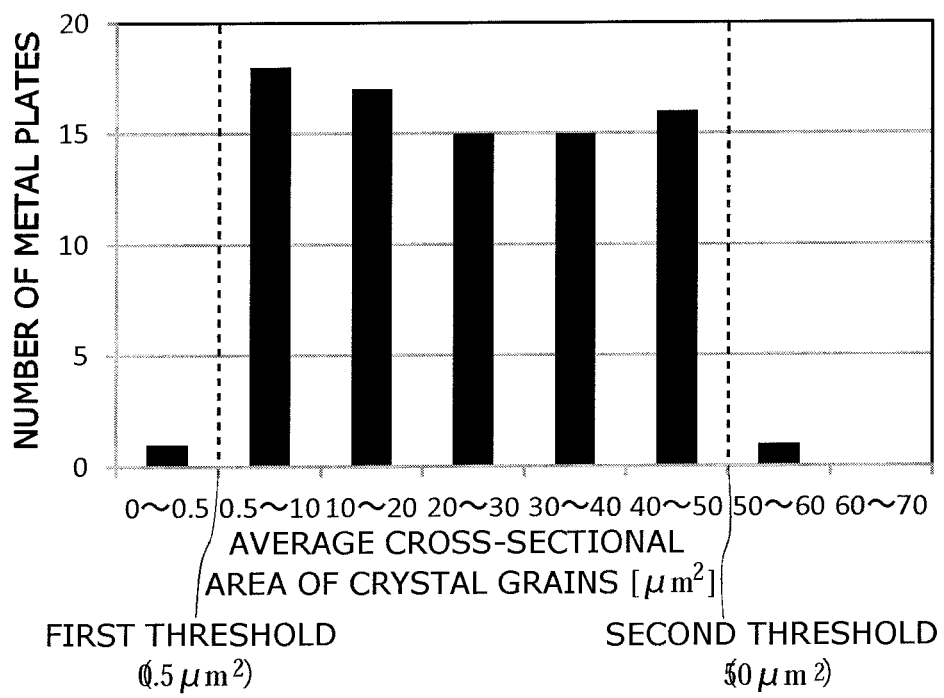
FIG. 27 is a view showing one example of distribution of the average cross-sectional area of crystal grains contained in a plurality of selected metal plates.

FIG. 27 is a view showing one example of distribution of the average cross-sectional area of crystal grains contained in a plurality of metal plates 64 selected based on the judgement condition that a metal plate having an average cross-sectional area of crystal grains of from 0.5 $\mu m^2$ to 50 $\mu m^2$ is judged as "Passed." In FIG. 27, the axis of abscissa represents the value of the average cross-sectional area of crystal grains calculated for each metal plate 64. In addition, the axis of coordinate represents the number of metal plates 64 with the average cross-sectional area of crystal grains in the range indicated in the axis of abscissa. For example, among the plurality of metal plates 64 selected above, the number of metal plates 64 having an average cross-sectional area of crystal grains of from 20 $\mu m^2$ to less than 30 $\mu m^2$ is 15. As shown in FIG. 27, in one case, some of the selected metal plates 64 may have an average cross-sectional area of crystal grains of less than 0.5 $\mu m^2$ or more than 50 $\mu m^2$ due to a measurement error or the like.

Figure 28:
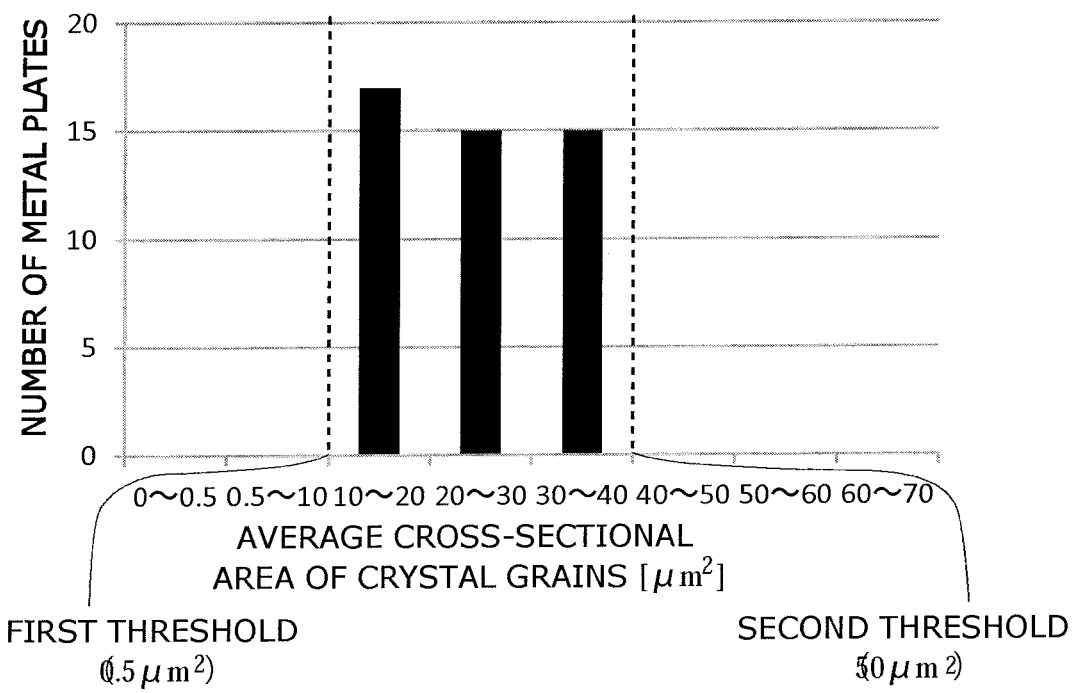
FIG. 28 is a view showing one example of distribution of the average cross-sectional area of crystal grains contained in a plurality of selected metal plates.

FIG. 28 is a view showing one example of distribution of the average cross-sectional area of crystal grains contained in a plurality of metal plates 64 selected based on the judgement condition that a metal plate having an average cross-sectional area of crystal grains of from 10 $\mu m^2$ to 40 $\mu m^2$ is judged as "Passed." The axis of abscissa and the axis of coordinate in FIG. 28 have the same meaning as in FIG. 27. In the example of FIG. 28, compared to the example of FIG. 27, the range of metal plates 64 that are judged as "Passed" and thus selected is narrow. In this case, performing the selection in FIG. 28 means performing the selection in FIG. 27.

The above description indicates an example of performing the inspection step of inspecting the metal plate 64 based on the average cross-sectional area of crystal grains in order to judge the passing status of the metal plate 64 for selection of the metal plate 64. Namely, an example in which the inspection step functions as a step of selecting a metal plate 64 in the method for manufacturing a metal plate 64 is shown. However, the inspection step may be used for the purpose other than the purpose of selecting a metal plate 64 in the method for manufacturing a metal plate 64.

In addition, selection conditions in the selection step are arbitrarily determined. For example, in the selection step, a metal plate 64, for which the average cross-sectional area of crystal grains is in the range determined based on a combination of any of the aforementioned plurality of second threshold candidates for specifying the upper limit and any of the aforementioned plurality of first threshold candidates for specifying the lower limit, may be selected. In addition, in the selection step, a metal plate 64, for which the average cross-sectional area of crystal grains is in the range determined based on a combination of any two of the plurality of second threshold candidates for specifying the upper limit, may be selected. Further, in the selection step, a metal plate 64, for which the average cross-sectional area of crystal grains is in the range determined based on a combination of any two of the plurality of first threshold candidates for specifying the lower limit, may be selected.

An example, in which the inspection step is used for the purpose other than the purpose of selecting a metal plate 64 in the method for manufacturing a metal plate 64, is described. For example, inspection of the metal plate 64 based on the average cross-sectional area of crystal grains may be utilized for optimizing conditions of manufacturing the metal plate 64, such as conditions in the rolling step or the annealing step and so on. Specifically, a metal plate 64 is firstly manufactured under various rolling conditions or annealing conditions, and the average cross-sectional area of crystal grains is calculated for the obtained metal plate 64. In addition, rolling conditions and annealing conditions are matched with the average cross-sectional area of crystal grains of the obtained metal plate 64. Accordingly, rolling conditions and annealing conditions for manufacturing a metal plate 64, for which the average cross-sectional area of crystal grains is from 0.5 $\mu m^2$ to 50 $\mu m^2$, with high probability can be found. As described above, inspection of the metal plate 64 based on the average cross-sectional area of crystal grains may be utilized for finding appropriate rolling conditions and annealing conditions. In this case, it is not necessary to perform the inspection step for calculating the average cross-sectional area of crystal grains for every metal plate 64 obtained in the actual manufacturing process. For example, the inspection step may be performed on some of the metal plates 64. Alternatively, after manufacturing conditions such as rolling conditions and annealing conditions have been once set, the inspection step for calculating the average cross-sectional area of crystal grains may not be performed at all.

Figure 29:
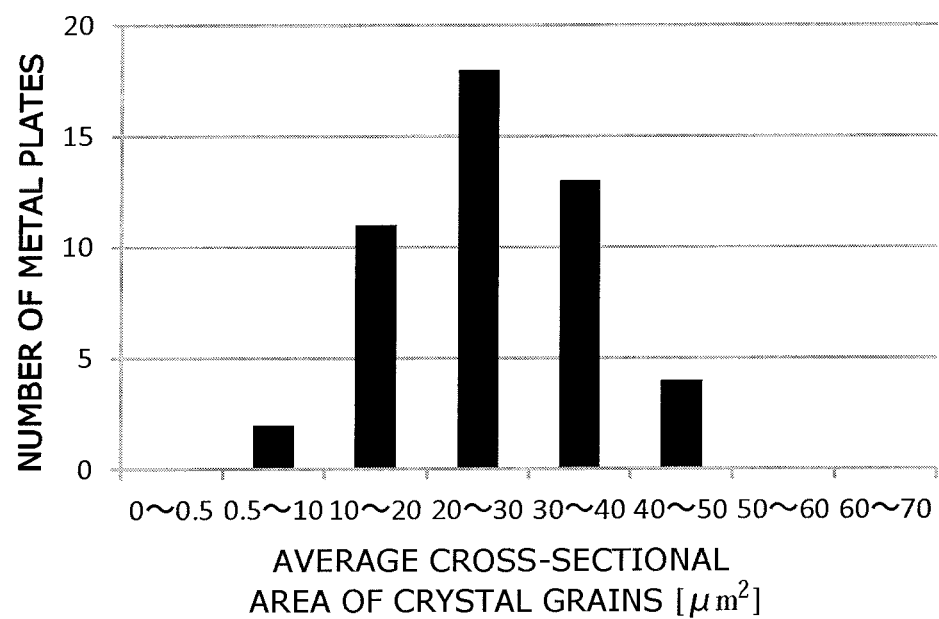
FIG. 29 is a view showing one example of distribution of the average cross-sectional area of crystal grains contained in a plurality of selected metal plates.

FIG. 29 is a view showing one example of distribution of the average cross-sectional area of crystal grains contained in a plurality of metal plates 64 manufactured based on the manufacturing conditions which have been found by utilizing a judgment condition that a metal plate 64 having an average cross-sectional area of crystal grains of from 0.5 $\mu m^2$ to 50 $\mu m^2$ is judged as "Passed." The axis of abscissa and the axis of coordinate in FIG. 29 have the same meaning as in FIG. 27. In the example of FIG. 29, even when the selection step is not performed, the plurality of manufactured metal plates 64 have an average cross-sectional area of crystal grains of from 0.5 $\mu m^2$ to 50 $\mu m^2$.

In addition, after the rolling step or the annealing step, a visual inspection step of visually inspecting a metal plate 64 may be performed. The visual inspection step may include a step of visually inspecting a metal plate 64 using an automated inspection machine. In addition, the visual inspection step may include a step of visually inspecting a metal plate 64 by eye observation.

In addition, after the rolling step or the annealing step, a shape inspection step of inspecting the shape of a metal plate 64 may be performed. For example, the position on the surface of a metal plate 64 in the thickness direction may be measured within a predetermined area of the metal plate 64 using a three-dimensional measuring device.

According to the method for manufacturing a metal plate in this embodiment, a metal plate 64 having an average cross-sectional area of crystal grains satisfying the aforementioned judgment conditions can be obtained. For example, a metal plate 64 having an average cross-sectional area of crystal grains of from 0.5 $\mu m^2$ to 50 $\mu m^2$ can be obtained.

In addition, in the aforementioned embodiment, an example, in which both the first threshold specifying the lower limit of the average cross-sectional area of crystal grains and the second threshold specifying the upper limit of the average cross-sectional area of crystal grains are used for judgment of the passing status of the metal plate 64 or selection of the metal plate 64 in the inspection step, is shown. However, not limited thereto, either one of the first threshold or the second threshold may be used for judgment of the passing status of the metal plate 64 or selection of the metal plate 64 in the inspection step.

For example, a metal plate 64 having an average cross-sectional area of crystal grains equal to or more than the first threshold may be judged as "Passed" or selected. When a metal plate 64 has an average cross-sectional area of crystal grains equal to or more than the first threshold, the metal plate 64 is allowed to have weldability.

Alternatively, a metal plate 64 having an average cross-sectional area of crystal grains equal to or less than the second threshold may be judged as "Passed" or selected. When a metal plate 64 has an average cross-sectional area of crystal grains equal to less than the second threshold, the metal plate 64 is allowed to have strength.

In addition, in the aforementioned embodiment, an example, in which rolling is adopted as a method for reducing the thickness of a metal plate 64, is shown. However, the disclosure is not limited to the example. For example, the thickness of a metal plate 64 may be reduced by etching the metal plate 64 from the first surface 64a side, the second surface 64b side, or both the first surface 64a side and the second surface 64b side. Such etching may be performed instead of the rolling step or in addition to the rolling step.

Even when the thickness of a metal plate 64 is reduced by etching, when the etched metal plate 64 has an average cross-sectional area of crystal grains equal to or more than the first threshold, the metal plate 64 is allowed to have weldability. In addition, when the average cross-sectional area of crystal grains of the etched metal plate 64 is not more than the second threshold, the metal plate 64 is allowed to have strength. Here, for example, the cross-sectional area of crystal grains in the metal plate 64 does not vary due to etching.

Figure 11:
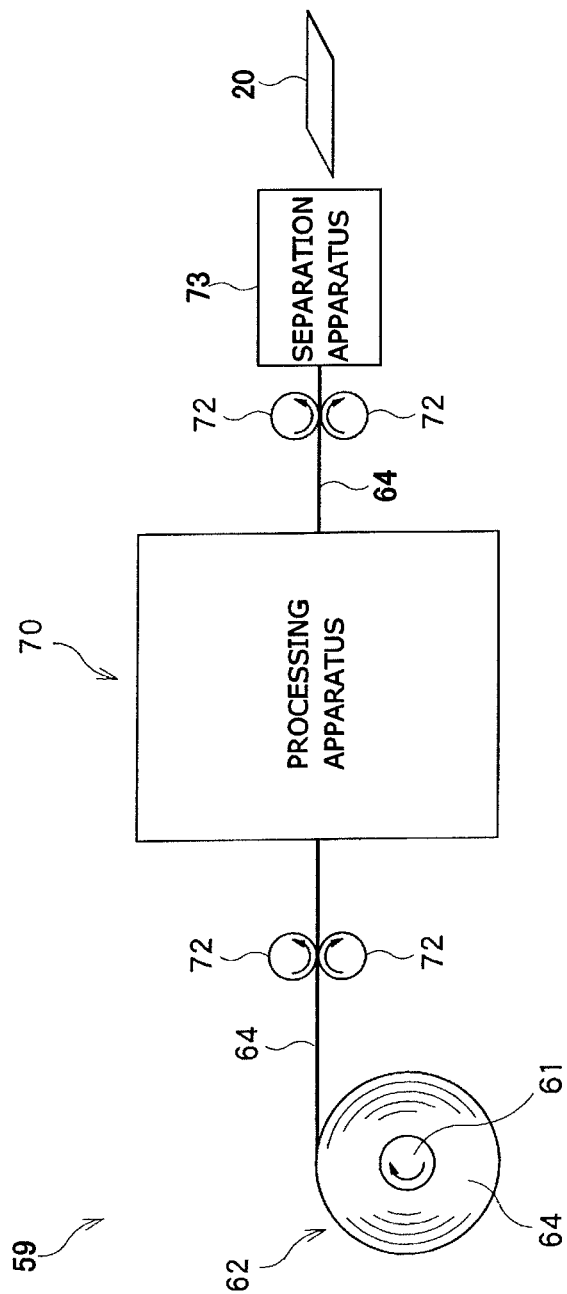
FIG. 11 is a schematic view for generally explaining an example of the method for manufacturing a deposition mask.

Next, a method for manufacturing a deposition mask 20 using a metal plate 64 having an average cross-sectional area of crystal grains in a range between the first threshold and the second threshold, for example, a metal plate 64 having an average cross-sectional area of crystal grains of from 0.5 $\mu m^2$ to 50 $\mu m^2$ is described mainly with reference to FIGS. 11 to 15. Herein, a method of manufacturing a deposition mask 20 by etching the metal plate 64 so as to form through-holes 25 in the metal plate 64. FIG. 11 shows a manufacturing apparatus 59 for manufacturing the deposition mask 20 using a metal plate 64. A winding body 62 having a core 61 around which the metal plate 64 is wound is firstly prepared. By rotating the core 61 to unwind the winding body 62, the metal plate 64 extending like a strip is supplied as shown in FIG. 11.

The supplied metal plate 64 is transported by transport rollers 72 to a processing apparatus 70 and then a separation apparatus 73. The processing apparatus 70 performs a processing step of forming through-holes 25 in the metal plate 64 by processing the metal plate 64. In this embodiment, a lot of through-holes 25 corresponding to a plurality of deposition masks 20 are formed in the metal plate 64. In other words, a plurality of deposition masks 20 are assigned to the metal plate 64. The separation apparatus 73 performs a separation step of separating a portion of the metal plate 64, in which a plurality of through-hole 25 corresponding to a single deposition mask 20 are formed, from the metal plate 64. Thus, a sheet-like deposition mask 20 can be obtained.

Figure 12:
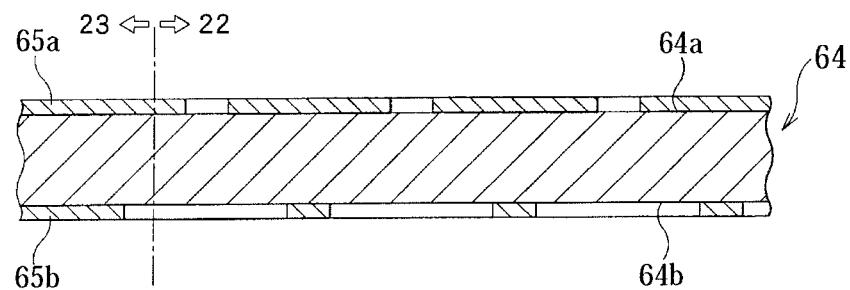
FIG. 12 is a view showing a step of forming a resist pattern on a metal plate.

The processing step is described with reference to FIGS. 12 to 15. A resist film containing a photosensitive resist material is firstly formed on a first surface 64a and a second surface 64b of a metal plate 64. For example, a coating solution containing a photosensitive resist material such as casein is applied to the metal plate 64, and then, the coating solution is dried to form a resist film. Alternatively, a resist film may be formed by attaching a dry film to the metal plate 64. Subsequently, the resist film is exposed and developed. Thus, as shown in FIG. 12, a first resist pattern 65a can be formed on the first surface 64a of the metal plate 64, and a second resist pattern 65b can be formed on the second surface 64b of the metal plate 64.

Figure 13:
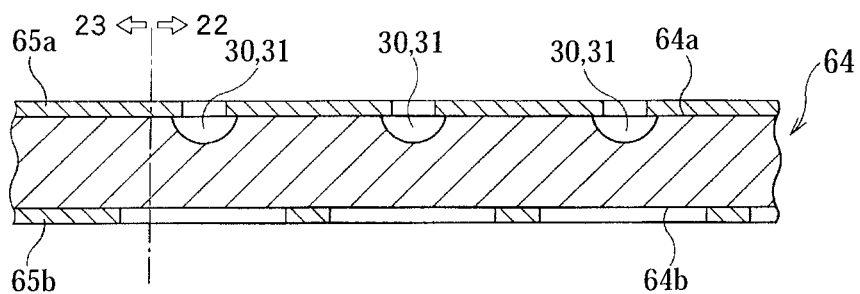
FIG. 13 is a view showing a first surface etching step.

Then, as shown in FIG. 13, there is performed a first surface etching step of etching the area of the first surface 64a of the metal plate 64, which is not covered with the first resist pattern 65a, by using a first etchant. For example, the first etchant is ejected from a nozzle, which is disposed on the side facing the first surface 64a of the transported metal plate 64, toward the first surface 64a of the metal plate 64 through the first resist pattern 65a. As a result, as shown in FIG. 13, areas of the metal plate 64, which are not covered with the first resist pattern 65a, are eroded by the first etchant. Thus, a lot of first recesses 30 are formed in the first surface 64a of the metal plate 64. The first etchant to be used is an etchant containing ferric chloride solution and hydrochloric acid.

Figure 14:
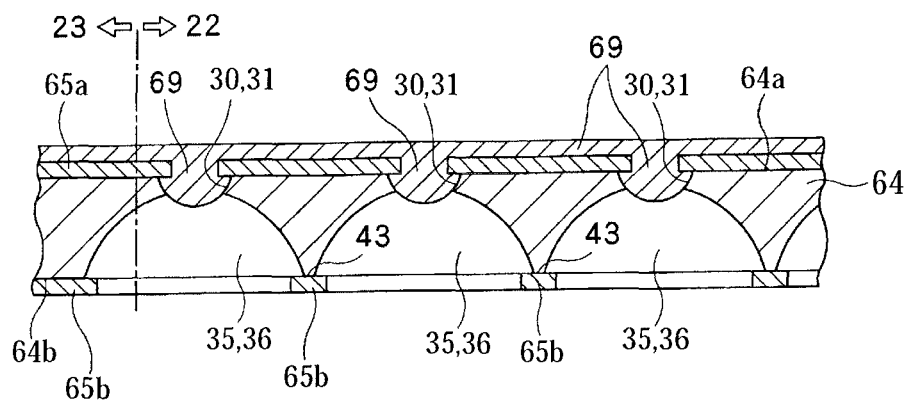
FIG. 14 is a view showing a second surface etching step.

Next, as shown in FIG. 14, there is performed the second surface etching step of etching an area of the second surface 64b of the metal plate 64, which is not covered with the second resist pattern 65b, to form second recesses 35 in the second surface 64b. The second surface etching step is performed until each first recess 30 and each second recess 35 communicate with each other so that a through-hole 25 is formed. Similarly, to the aforementioned first etchant, the second etchant to be used is an etchant containing ferric chloride solution and hydrochloric acid. As shown in FIG. 14, the first recesses 30 may be coated with a resin 69 resistant to the second etchant in the second surface etching step.

Figure 15:
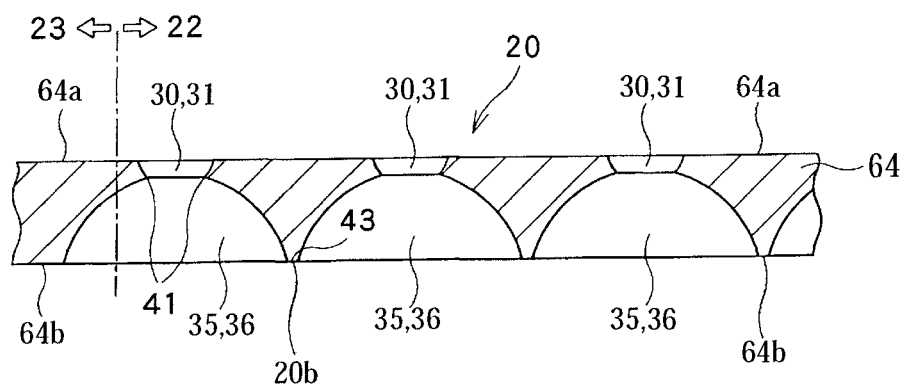
FIG. 15 is a view showing a step of removing a resin and a resist pattern from the metal plate.

After that, as shown in FIG. 15, the resin 69 is removed from the metal plate 64. For example, the resin 69 can be removed by using an alkali-based peeling liquid. When the alkali-based peeling liquid is used, as shown in FIG. 15, the resist patterns 65a and 65b are removed simultaneously with the removal of the resin 69. However, after the removal of the resin 69, the resist patterns 65a and 65b may be removed separately from the resin 69 using a peeling liquid different from the peeling liquid for peeling off the resin 69.

Thereafter, a plurality of deposition masks 20 assigned to the metal plate 64 are separately removed one by one. For example, a portion of the metal plate 64, in which a plurality of through-hole 25 corresponding to a single deposition mask 20 are formed, is separate from the other portion of the metal plate 64. Thus, deposition masks 20 can be obtained.

The method of forming the through-holes 25 in the metal plate 64 is not limited to etching. For example, the through-holes 25 may be formed in the metal plate 64 by a laser process that irradiates the metal plate 64 with laser. Also in this case, by setting the average cross-sectional area of crystal grains to from 0.5 $\mu m^2$ to 50 $\mu m^2$, it is possible to allow a metal plate to have strength and weldability even when the metal plate has a thickness of equal to or less than 30 μm. Thus, it is possible to suppress the formation of a localized deformed portion such as a recess in a metal plate in the step of manufacturing a deposition mask 20 or when handling a deposition mask 20.

Figure 16:
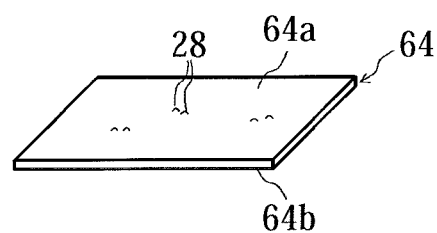
FIG. 16 is a view showing an example of a deformed portion that is locally formed in the metal plate.

Subsequently, a deposition mask inspection step of inspecting each deposition mask 20 may be performed. In the deposition mask inspection step, for example, it is inspected whether or not there is a deformed portion of a protrusion, recess, or the like locally formed on the surface of the metal plate 64 constituting the deposition mask 20. FIG. 16 is a view showing an example of a deformed portion 28 which can be formed on a metal plate 64. In the example shown in FIG. 16, the deformed portion 28 is a recess locally formed on the second surface 64b of the metal plate 64.

Figure 17:
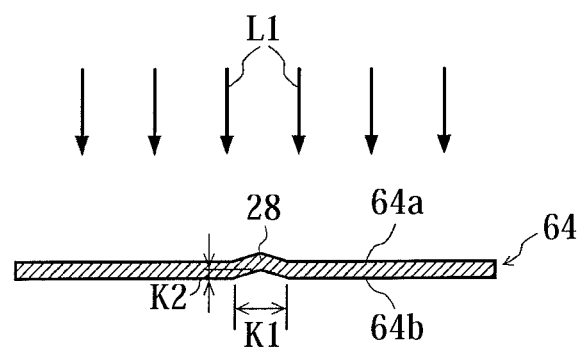
FIG. 17 is a view showing an example of the cross-sectional shape of the deformed portion of the metal plate shown in FIG. 16.

FIG. 17 is a view showing an example of the cross-sectional shape of the deformed portion 28 of the metal plate 64 shown in FIG. 16. As shown in FIG. 17, the deformed portion 28 locally formed as a recess on the second surface 64b may appear as a protrusion locally formed on the first surface 64a. Size K1 of the deformed portion 28 in the planar direction of the metal plate 64 is, for example, 0.5 μm to several nanometers. In addition, when the deformed portion 28 is a localized recess, depth K2 of the recess is, for example, from 0.5 μm to 10 μm.

In the deposition mask inspection step, for example, as shown in FIG. 17, the first surface 64a or the second surface 64b of a metal plate 64 constituting a deposition mask 20 is irradiated with light L1, and it is visually confirmed whether or not there is any deformed portion 28 in the metal plate 64. When there is no deformed portion 28 on the first surface 64a or the second surface 64b of the metal plate 64 of the deposition mask 20, the deposition mask 20 may be judged as "Passed." When even one deformed portion 28 is present thereon, the deposition mask 20 may be judged as "Failed."

In this embodiment, as described above, a deposition mask 20 is manufactured using a metal plate 64 having an average cross-sectional area of crystal grains of 50 $\mu m^2$ or less. Therefore, even when the thickness of the metal plate 64 is 30 μm or less, strength of the metal plate 64 can be ensured. Accordingly, it is possible to prevent the formation of a deformed portion 28 on a metal plate 64 during the step of manufacturing a deposition mask 20. Therefore, it is possible to reduce the proportion of deposition masks 20 judged as "Failed" in the deposition mask inspection step.

Next, there is performed a fixation step of fixing a deposition mask 20 obtained as described above to a frame 15. Thus, a deposition mask apparatus 10 including a deposition mask 20 and a frame 15 can be obtained.

Figure 18:
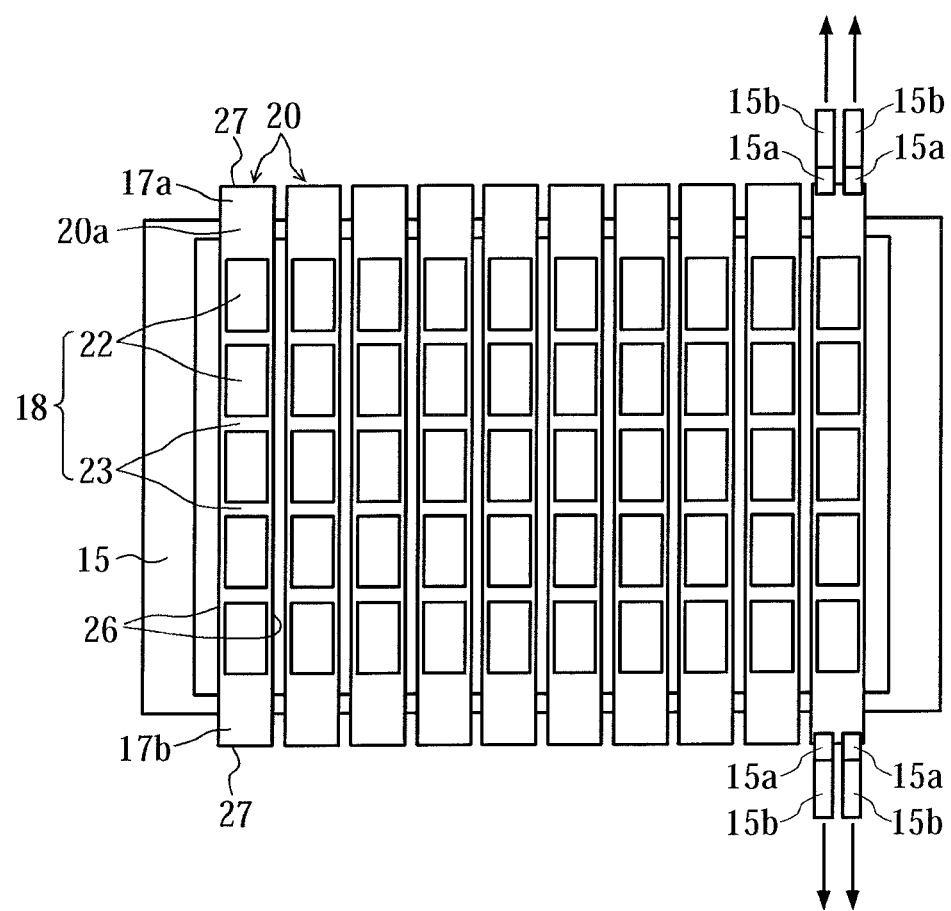
FIG. 18 is a view showing an example of a stretching step of adjusting the position of a deposition mask relative to a frame in a state in which tension is applied to the deposition mask.

In the fixation step, there is firstly performed a stretching step of adjusting the position of a deposition mask 20 relative to a frame 15 in a state in which tension is applied to the deposition mask 20. In the stretching step, as shown in FIG. 18, ear portions 17a and 17b of a deposition mask 20 are firstly clamped and held by clamp portions 15a. In the example shown in FIG. 18, one ear portion 17a is held by two clamp portions 15a. Here, the number and arrangement of clamp portions 15a are arbitrarily determined. Next, the position and tension of a deposition mask 20 are adjusted such that a difference between the position of every through-hole 25 of the deposition mask 20 and the position of an electrode on an organic EL substrate 92 (or a substrate simulating an organic EL substrate 92) is not more than a predetermined reference value while tension is applied to a deposition mask 20 via pull-out portions 15b joined to clamp portions 15a. The reference value is, for example, 5 μm.

Figure 19A:
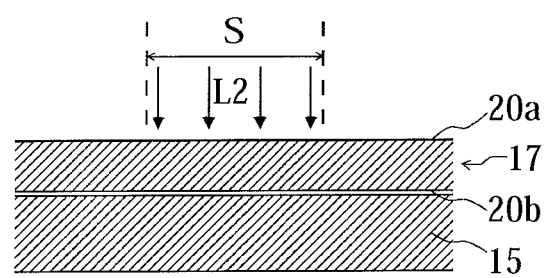
FIG. 19A is a view showing a welding step of welding a deposition mask to a frame.

In the welding step, as shown in FIG. 19A, an ear portion 17 of a deposition mask 20 is firstly placed on a frame 15 such that the second surface 20b faces the frame 15. Next, the ear portion 17 of the deposition mask 20 is heated so as to weld the ear portion 17 to the frame 15. As a method for heating the ear portion 17, for example, a method in which the ear portion 17 is irradiated with laser light L2 can be adopted. For example, YAG laser light generated by a YAG laser system can be used as laser light L2. The spot diameter S of laser light L2 is, for example, from 0.1 mm to 0.3 mm.

For example, as a YAG laser system, a system including a crystal of YAG (yttrium aluminum garnet) doped with Nd (neodymium) as an oscillation medium can be used. In this case, laser light with a wavelength of about 1064 nm is generated as the fundamental. In addition, a second harmonic with a wavelength of about 532 nm is produced by passing the fundamental through a nonlinear optical crystal. In addition, a third harmonic with a wavelength of about 355 nm is produced by passing the fundamental and second harmonic through a nonlinear optical crystal. The third harmonic of YAG laser light is likely to be absorbed by an iron alloy containing nickel. Therefore, when a metal plate 64 constituting ear portions 17 contains an iron alloy containing nickel, it is preferable that laser light L2 irradiated toward ear portions 17 has the third harmonic of YAG laser light.

Figure 19B:
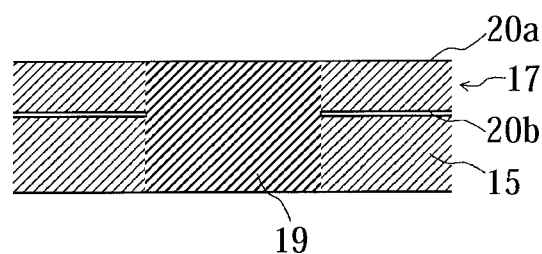
FIG. 19B is a view showing a welded portion formed by the welding step.

When the ear portion 17 is irradiated with laser light L2, the ear portion 17 of the deposition mask 20 and the frame 15 are partially melted, and thus, a welded portion 19 bridging over the ear portion 17 and the frame 15 is formed as shown in FIG. 19B.

Figure 20:
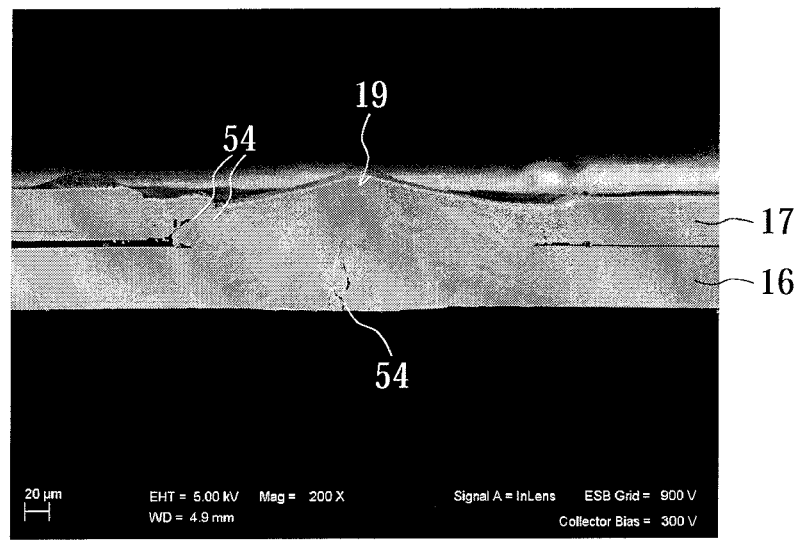
FIG. 20 is a view showing an example of an unfavorable welded portion.
Figure 21:
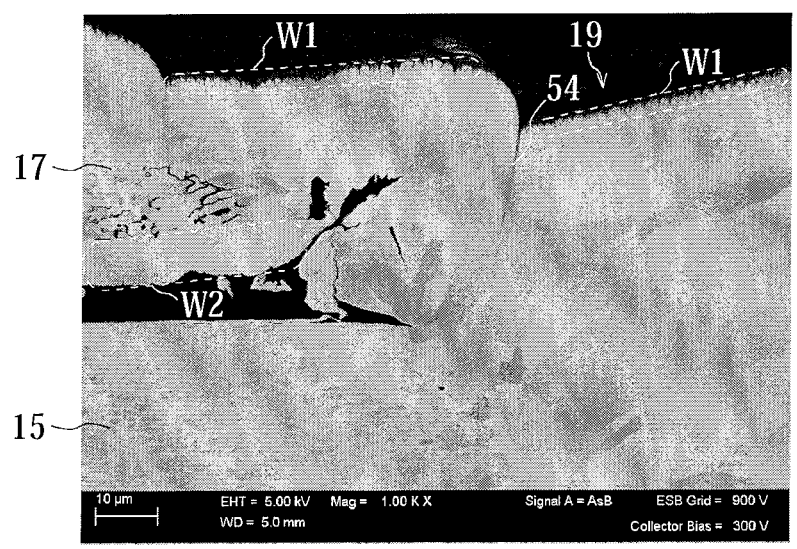
FIG. 21 is an enlarged view of the welded portion of FIG. 20.

Incidentally, in this embodiment, crystal grains of a metal plate 64 are refined. Specifically, the average cross-sectional area of crystal grains in the metal plate 64 is 50 $\mu m^2$ or less. Meanwhile, new crystal grains are generated by recrystallization in the welded portion 19 which is melted by heating and then solidified. The size of crystal grains which are newly generated in the welded portion 19 is usually larger than the size of the existing crystal grains. Therefore, the size of crystal grains in the welded portion 19 of the metal plate 64 after welding is considered to be greater than the size of crystal grains in the peripheral portion of the welded portion 19. When the size of crystal grains is large, a defect such as a crack is likely to be formed in the metal plate 64. FIG. 20 is a cross-sectional image showing a welded portion 19 formed when an ear portion 17 of a deposition mask 20 prepared from a metal plate 64 was welded to a member 16. As a member 16, an invar material having a thickness greater than that of the ear portion 17 was used. FIG. 21 is an enlarged view of the welded portion 19 of FIG. 20. In the example shown in FIGS. 20 and 21, cracks 54 are formed in the boundary between the welded portion 19 and its peripheral portion of the ear portion 17 and on the surface of the member 16.

A cross-sectional observation method in FIGS. 20 and 21 is described below. An ear portion 17 is firstly welded to a member 16. Thereafter, a portion including the welded portion 19 is cut out using metal scissors, thereby preparing an object to be observed. Next, the object to be observed is processed using an ion milling apparatus, thereby generating a cross section to be observed.

Cross section polisher IB-09010 CP manufactured by JEOL Ltd. can be used as an ion milling apparatus. Processing conditions are exemplified below.

Processing conditions: 6 kV, 1.5 hours, protrusion width: 100 μm

In usual processing, an object to be observed is embedded in a resin and then irradiated with argon ions. However, in this case, when an object to be observed was embedded in a resin, as it was difficult to adjust the position of a cross section of the object to be observed to the center of the welded portion 19, the object to be observed was irradiated with argon ions without being embedded in the resin. Therefore, as is understood from the area surrounded by a dotted line represented by symbol W1 shown in FIG. 21 and FIG. 23 described later, there are streaks of processing marks resulting from damage received from argon ions on the surface on the ear 17 side of the object to be observed. In addition, as is understood from the area surrounded by a dotted line represented by symbol W2 shown in FIG. 21, a deposition layer in which the material removed by processing is deposited may be formed in the gap between the ear 17 and the member 16. Here, the inventors consider that these processing marks and the deposition layer do not have any particular disadvantageous impact on observation of the crystalline state in the welded portion 19 and its peripheral portion and/or the presence or absence of cracks.

Next, the cross section is observed using SEM. For example, ULTRA 55 manufactured by Carl Zeiss AG can be used as SEM. Observation conditions for SEM are exemplified below.

Acceleration voltage: 5 kV
Working distance: 4.5 mm
Detector: Inlens
Aperture: 60 μm High Current
Observation magnification: 200 times and 1000 times
(The observation magnification standard at the time of photography is Polaroid 545.)

Figure 22:
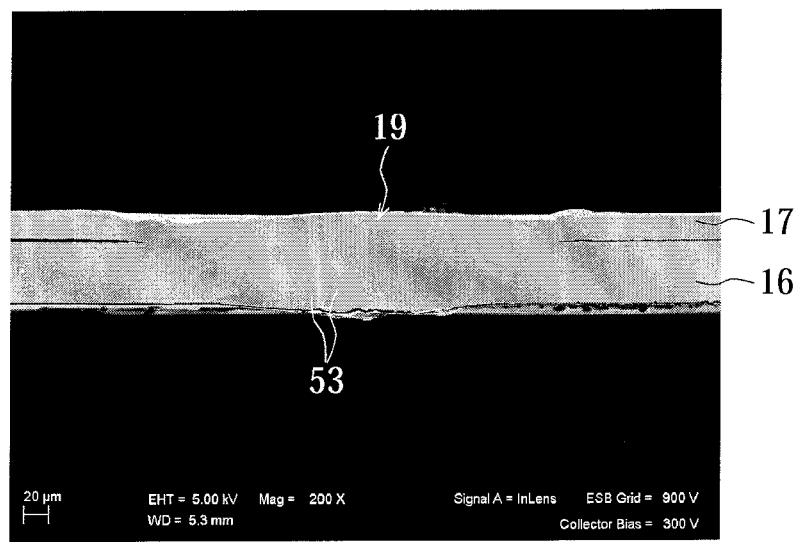
FIG. 22 is a view showing an example of a preferable welded portion.
Figure 23:
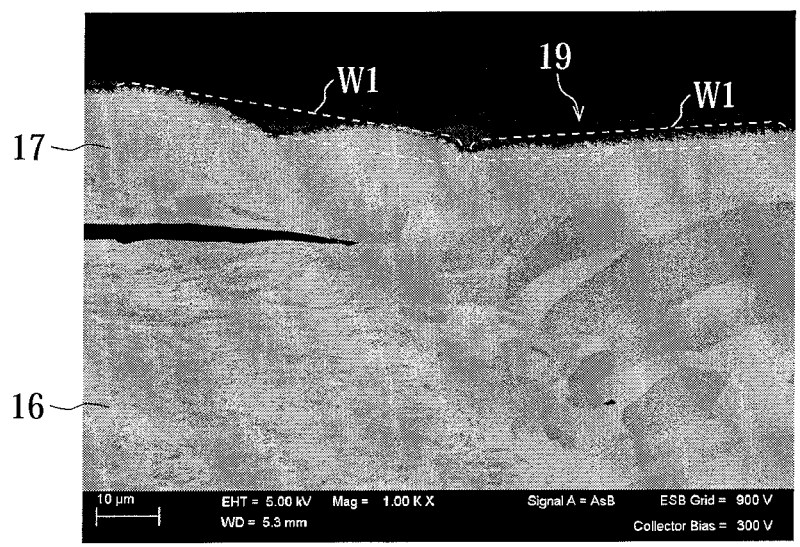
FIG. 23 is an enlarged view of the welded portion of FIG. 22.

It is considered that cracks 54 shown in FIGS. 20 and 21 were generated due to the fact that there is a large difference between the size of crystal grains in the welded portion 19 and the size of crystal grains in the peripheral portion of the welded portion 19. Here, in this embodiment, as described above, a deposition mask 20 is manufactured using a metal plate 64 having an average cross-sectional area of crystal grains of 0.5 μm² or more. Thus, it is possible to suppress an increase in the difference between the size of crystal grains in the welded portion 19 and the size of crystal grains in the peripheral portion of the welded portion 19. Accordingly, it is possible to prevent the generation of cracks on the surface of the metal plate 64 after the welded portion 19 has been formed. FIG. 22 is a cross-sectional image of the metal plate 64 and the frame 15 in which no cracks were generated. In addition, FIG. 23 is an enlarged view of the welded portion 19 of FIG. 22.

The aforementioned embodiment can be variously modified. Hereinbelow, modification examples are described with reference to the drawings according to need. In the below description and the drawings used in the below description, a part that can be similarly constituted to the above embodiment has the same symbol as that of corresponding part the above embodiment, and overlapped description is omitted. In addition, when the effect obtained by the aforementioned embodiment is apparently obtained in the modification examples, description thereof is possibly omitted.

In the aforementioned embodiment, an example, in which the ear portion 17 is welded to the frame 15 by irradiating the ear portion 17 with laser light L2, is shown. However, the method for heating the ear portion 17 is not limited to the method in which the ear portion 17 is irradiated with laser light L2. For example, the ear portion 17 may be heated by applying an electric current to the ear portion 17 and the frame 15.

In the aforementioned embodiment, an example, in which the metal plate 64 is obtained by rolling a base metal, is shown. However, not limited thereto, a metal plate 64 having a desired thickness may be manufactured by a foil creating step utilizing a plating process. In the foil creating step, for example, while a drum made of stainless, which is partially immersed in a plating liquid, is rotated, a plating film is formed on a surface of the drum. By peeling off this plating film, an elongated metal plate can be prepared by roll-to-roll processing. When a metal plate is manufactured of an iron alloy containing nickel, a mixture solution of a solution containing a nickel compound and a solution of an iron compound may be used as a plating liquid. For example, a mixture solution of a solution containing nickel sulfamate and a solution containing iron sulfamate may be used, for example. An additive such as malonic acid or saccharin may be contained in the plating liquid.

Then, the aforementioned annealing step may be performed to the metal plate obtained in this manner. In addition, before or after the annealing step, there may be performed the aforementioned slitting step of severing both ends of the metal plate, so as to adjust the width of the metal plate into a desired width.

As in the case of the aforementioned embodiment, also when a metal plate is prepared by utilizing the plating process, a metal plate 64 is manufactured such that crystal grains that the average cross-sectional area of crystal grains on a cross section of the metal plate having an angle of from −10° to +10° with respect to a plane perpendicular to a longitudinal direction of the metal plate 64 (plating film) is from 0.5 μm² to 50 μm². For example, conditions of the composition of plating liquid, the temperature and period of time in a foil creating step, and the like are adjusted. In addition, conditions of the annealing step may also be adjusted. By setting the average cross-sectional area of crystal grains to from 0.5 μm² to 50 μm², it is possible to allow a metal plate to have strength and weldability even when the metal plate has a thickness of 30 µm or less as in the case of the aforementioned embodiment. Accordingly, it is possible to suppress the formation of a localized deformed portion such as a recess in a metal plate in the step of manufacturing a deposition mask 20 or when handling a deposition mask 20. In addition, when welding the deposition mask 20 to the frame 15, it is possible to suppress the formation of defects such as cracks in the deposition mask 20 or the frame 15. Here, the longitudinal direction of a plating film is a direction of the extension of an elongated metal plate that is formed by film formation of a metal on the surface of a drum by the plating process while rotating the drum.

In the aforementioned embodiment, an example, in which a deposition mask 20 is manufactured by etching or laser processing a metal plate 64 to form through-holes 25 in the metal plate 64, is shown. However, not limited thereto, it is also possible to form a plated layer on a substrate in a predetermined pattern corresponding to through-holes 25 and remove the plated layer from the substrate, thereby manufacturing a deposition mask 20. Since such a method for manufacturing a deposition mask 20 is disclosed in, for example, JP2016-148112A, the detailed description of the method is omitted herein.

A deposition mask 20 is manufactured such that the average cross-sectional area of crystal grains in a metal plate 64 made of a plated layer constituting a deposition mask 20 is from 0.5 $µm^2$ to 50 $µm^2$ also in the case of manufacturing a deposition mask 20 by plating. For example, conditions of the composition of plating liquid, the temperature and period of time in a plating step, and the like are adjusted. In addition, conditions of the annealing step to be performed after the plating step may also be adjusted. By setting the average cross-sectional area of crystal grains to from 0.5 $µm^2$ to 50 $µm^2$, it is possible to allow a metal plate to have strength and weldability even when the metal plate has a thickness of 30 µm or less as in the case of the aforementioned embodiment. Accordingly, it is possible to suppress the formation of a localized deformed portion such as a recess in a metal plate in the step of manufacturing a deposition mask 20 or when handling a deposition mask 20. In addition, when welding the deposition mask 20 to the frame 15, it is possible to suppress the formation of defects such as cracks in the deposition mask 20 or the frame 15.

EXAMPLES

Next, the embodiment of the disclosure is described in more detail based on examples, and the embodiment of the disclosure is not limited to the below description of the examples unless the present invention departs from its spirit.

Example 1

A metal plate 64 having a thickness of 40 µm made of an iron alloy containing 36% by mass of nickel, balancing iron and unavoidable impurities was prepared by rolling. The thickness of the metal plate before rolling was 100 µm. Therefore, the rolling reduction was 60%.

Next, the EBSD pattern was measured by the aforementioned EBSD method. In addition, the average cross-sectional area of crystal grains on a cross section of the metal plate 64 was calculated by analyzing the EBSD pattern. As a result, the average cross-sectional area was 113.4 $µm^2$.

Conditions of measurement by the EBSD method are as follows.

Observation magnification in SEM: 2000 times or 5000 times (The observation magnification standard at the time of photography is Polaroid 545.)
Acceleration voltage in SEM: 15 kV
Working distance in SEM: 15 mm
Inclined angle of sample φ1: 70 degrees
EBSD step size (in the case of SEM observation magnification of 2000 times): 70 nm
EBSD step size (in the case of SEM observation magnification of 5000 times): 50 nm The SEM observation magnification is described in detail. When the average cross-sectional area of crystal grains was large, the observation magnification in SEM was determined to be 2000 times. Specifically, when the average cross-sectional area of crystal grains was 2 $µm^2$ or more (in the cases of Examples 1 to 8 and Examples 10 to 14 described later), the observation magnification in SEM was determined to be 2000 times.

Here, when the observation magnification in SEM is 2000 times (the observation magnification standard at the time of photography is Polaroid 545), the image size is about 60 µm×about 45 µm. In this case, a cross section of a metal plate 64 is measured such that the direction of the size of about 45 µm corresponds to the thickness direction of the metal plate 64. Therefore, the area of the cross section of the metal plate 64 observed in one image (hereinafter referred to as "measurement effective area") is expressed as "thickness of metal plate 64 (13 to 40 µm)×about 60 µm."

When the number of crystal grains that appear in the measurement area was less than 1000, an image in which 1000 or more crystal grains appeared was generated by acquiring an image at a plurality of positions of a cross section of the metal plate 64 while shifting the measurement target area by about 50 µm at one time and connecting the obtained plurality of images.

When the average cross-sectional area of crystal grains was small, the observation magnification in SEM was determined to be 5000 times. Specifically, when the average cross-sectional area of crystal grains was less than 2 $µm^2$ (in the cases of Examples 1 to 9, 15, and 16 described later), the observation magnification in SEM was determined to be 5000 times.

Here, when the observation magnification in SEM is 5000 times (the observation magnification standard at the time of photography is Polaroid 545), the image size is about 24 µm×about 18 µm. In this case, a cross section of a metal plate 64 is measured such that the direction of the size of about 18 µm corresponds to the thickness direction of the metal plate 64. When the average cross-sectional area of crystal grains was less than 2 $µm^2$, 1000 or more crystal grains could be observed at one measurement (one image). Thus, there was no need to connect a plurality of images.

Crystal orientation analysis software OIM (Ver. 7.3) manufactured by TSL Solutions was used as software for EBSD pattern analysis.

In the EBSD pattern analysis step, analysis was performed by the area method under conditions where a portion with a difference in crystal orientation of 5 degrees or more was recognized as a crystal grain boundary 52. In addition, in the analysis step, analysis was performed while excluding data with a CI value of 0.15 or less, the value being defined by crystal orientation analysis software OIM (Ver. 7.3). This makes it possible to eliminate the effects of the resin used in pretreatment which is present on the front and back surfaces of the sample 56 and/or the crystal or amorphous grain boundaries present in the cross section of the sample 56. For analysis by the area method, the average value of the cross-sectional area of crystal grains with a CI value of more than 0.15 is calculated by an area fraction method and designated as the average cross-sectional area of crystal grains. In the area fraction method, when the total area of the measurement area including crystals in cross-sectional areas a, b, c, d is 100, the average cross-sectional area is calculated in consideration of area weighting as in the following formula (1).

$$\text{Average cross-sectional area} = (a \times a/100) + (b \times b/100) + (c \times c/100) + (d \times d/100) \quad (1)$$

In the below description, the average cross-sectional area of crystal grains, which is calculated by the analysis by the area method using the Area Fraction method after having excluded data with a CI value of 0.15 or less, is also referred to as the area average cross-sectional area. The aforementioned average cross-sectional area whose preferable range is determined by the aforementioned first threshold and the second threshold is the area average cross-sectional area.

In addition, the average cross-sectional area of crystal grains, which is calculated by the analysis using the number method after having excluded data with a CI value of equal to or less than 0.15, is also referred to as the number average cross-sectional area. Similar to the case of the area average cross-sectional area, as a soft for analyzing an EBSD pattern, a crystal orientation analysis software OIM (Ver. 7.3) manufactured by TSL Solutions was used. Also in the calculation of the number average
e cross-sectional area, analysis was performed by the area method under conditions where a portion with a difference in crystal orientation of equal to or more than 5 degrees was recognized as a crystal grain boundary 52, by excluding data with a CI value of equal to or less than 0.15, the value being defined by crystal orientation analysis software OIM (Ver. 7.3). The average value of the cross-sectional area of crystal grains with a CI value of equal to or more than 0.15 was calculated by the number method and was employed as the number average cross-sectional area of crystal grains. In the aforementioned area fraction method, the average cross-sectional area is calculated in consideration of area weighting. On the other hand, in the number method, the average cross-sectional area is calculated in consideration of all the crystal grains to be analyzed as the same weighting regardless of area.

Next, a deposition mask 20 was manufactured using a metal plate 64. Thereafter, strength of the metal plate 64 constituting a deposition mask 20 was evaluated. Specifically, it was observed whether any deformed portion 28 such as a recess was present or absent on the surface of the obtained deposition mask 20 by irradiating the deposition mask 20 with light L1 as shown in FIG. 17. As a result, there was no deformed portion 28.

Conditions of observation of the surface of the deposition mask 20 are as follows.
  Luminance of light L1: 500 lux to 2000 lux, e.g., 1000 lux
  Light source of light L1: Three-wavelength fluorescent lamp
  Incident angle of light L1: 15 degrees to 45 degrees
  Distance from the light source to the surface of the deposition mask: 30 cm to 100 cm, e.g., 50 cm
  Distance from the viewpoint to the surface of the deposition mask: 15 cm Next, weldability of the deposition mask 20 was evaluated. Specifically, an ear portion 17 of a deposition mask 20 was irradiated with laser light L2 so as to weld the ear portion 17 to a frame 15, and welding strength between the ear portion 17 and the frame 15 was measured. Conditions of welding the ear portion 17 to the frame 15 are as follows.
  Wavelength of laser light L2: 355 nm
  Spot diameter of laser light L2: 200 μm
  Output of laser light L2: 0.3 kW
  Irradiation time of laser light L2: 0.3 ms Welding strength is the degree of force required to remove the ear portion 17 of the deposition mask 20 welded to the frame 15 via the welded portion 19 from the frame 15. FIG. 24 is a view showing an example of a method for measuring welding strength of a welded portion 19. In the step of measuring welding strength, a sample 17S obtained by cutting a part of the ear portion 17 of the deposition mask 20 is firstly welded to the frame 15. Then, as shown in FIG. 24, tensile force E in the direction along the normal direction of the frame 15 is applied to the end in the longitudinal direction of the sample 17S. In this case, tensile force E at which the sample 17S breaks or the sample 17S is peeled off from the frame 15 corresponds to the welding strength of the welded portion 19. Here, the longitudinal direction of the sample 17S is parallel to the rolling direction D1 of the metal plate 64. A deposition mask 20 is usually manufactured from a metal plate 64 such that the longitudinal direction of the deposition mask 20 is parallel to the rolling direction D1 of the metal plate 64. Therefore, the rolling direction D1 can be recognized based on the longitudinal direction of the deposition mask 20.

In addition, a deposition mask 20 may be manufactured from a metal plate 64 such that the longitudinal direction of the deposition mask 20 is non-parallel to the rolling direction D1 of the metal plate 64. In this case, the rolling direction D1 may be identified based on the direction in which crystal grains of the metal plate 64 extend. This is because crystal grains extend parallel to the rolling direction D1 of the metal plate 64 manufactured by rolling.

Seven samples 17S were prepared from one deposition mask 20, and welding strength was measured for each sample 17S. As a result, the average value of welding strength was 157 mN. In addition, cracks were generated in the boundary between the welded portion 19 and its peripheral portion.

Examples 2 to 16

Metal plates 64 according to Examples 2 to 16 were prepared by changing at least one of the thickness, composition, or manufacturing conditions of the metal plate in Example 1. Thicknesses of the metal plates 64 in the Examples are described below. In Examples 1 to 8 and Examples 10 to 14, the metal plate 64 was prepared by rolling a base metal of an iron alloy. Meanwhile, in Examples 9, 15, and 16, the metal plate 64 was prepared by the foil creating step using the plating process. Regarding the Examples in which the metal plate 64 was prepared by rolling, thickness T1 before rolling and rolling reduction are described below together with thickness T2 after rolling for each metal plate.
  Example 2: T1=100 μm, T2=35 μm, rolling reduction=65° k
  Example 3: T1=100 μm, T2=30 μm, rolling reduction=70%
  Example 4: T1=75 μm, T2=30 μm, rolling reduction=60%
  Example 5: T1=100 μm, T2=25 μm, rolling reduction=75%
  Example 6: T1=50 μm, T2=20 μm, rolling reduction=60%
  Example 7: T1=80 μm, T2=20 μm, rolling reduction=75%

Example 8: T1=100 μm, T2=20 μm, rolling reduction=80%

Example 9: 20 μm

Example 10: T1=37.5 μm, T2=15 μm, rolling reduction=60%

Example 11: T1=50 μm, T2=15 μm, rolling reduction=70%

Example 12: T1=100 μm, T2=15 μm, rolling reduction=85° k

Example 13: T1=300 μm, T2=15 μm, rolling reduction=95° k

Example 14: T1=100 μm, T2=13 μm, rolling reduction=87%

Example 15 and Example 16: 10 μm

In addition, as in the case of Example 1, the area average cross-sectional area and the number average cross-sectional area of crystal grains on a cross section of the metal plate 64 in each of Examples 2 to 16 was calculated. FIG. 25 summarizes the results. In the column "Judgment" in FIG. 25, "OK" means that the area average cross-sectional area of crystal grains was from 0.5 $μm^2$ to 50 $μm^2$. In addition, "NG" means that the area average cross-sectional area of crystal grains was less than 0.5 $μm^2$ or more than 50 $μm^2$.

Further, as in the case of Example 1, a deposition mask 20 was prepared using the metal plate 64 in each of Examples 2 to 16. Next, as in the case of Example 1, it was observed whether any deformed portion 28 such as a recess was present or absent on the surface of the obtained deposition mask 20. Furthermore, as in the case of Example 1, welding strength was measured by welding the ear portion 17 of the deposition mask 20 to the frame 15. FIG. 25 summarizes the results.

In Examples 9, 15, and 16, the area average cross-sectional area of crystal grains of the metal plate 64 was less than 0.5 $μm^2$. As a result, the welding strength was found to be less than 200 mN. In addition, cracks were generated in the boundary between the welding portion 19 and its peripheral portion.

In Example 4 and Examples 6 to 10, the area average cross-sectional area of crystal grains of the metal plate 64 was more than 50 $μm^2$. As a result, deformed portions 28 such as recesses were present on the surface of the deposition mask 20.

Meanwhile, the area average cross-sectional area of crystal grains was from 0.5 $μm^2$ to 50 $μm^2$ for the metal plates 64 having a thickness of from 10 μm to 30 μm in Examples 3, 5, 7, 8, and 11 to 14. As a result, it was possible to achieve welding strength at 200 mN or more, more specifically 220 mN or more. In addition, it was possible to suppress the formation of any deformed portion 28 such as a recess on the surface of the deposition mask 20. This means that it was possible to allow the metal plate 64 to have both strength and weldability.

Although the area average cross-sectional area of crystal grains was more than 50 $μm^2$ for the metal plate 64 having a thickness of 35 μm or more in Examples 1 and 2, any deformed portion 28 such as recess was not formed on the surface of the deposition mask 20. It is considered that since the thickness of the deposition mask 20 was large and thus the deposition mask 20 had sufficiently high strength, any deformed portion 28 such as a recess was not formed regardless of the area average cross-sectional area of crystal grains. Accordingly, it can be said that the reference value of the area average cross-sectional area of crystal grains which is set to 50 $μm^2$ or more in this embodiment is effective particularly when the thickness of the metal plate 64 is 30 μm or less or less. Here, the metal plate 64 having a thickness of 35 μm or more shown in Examples 1 and 2 is more disadvantageous than the metal plate 64 having a thickness of 30 μm or less in that use efficiency of the deposition material 98 in the deposition mask 20 prepared from the metal plate 64 is reduced.

Figure 26:
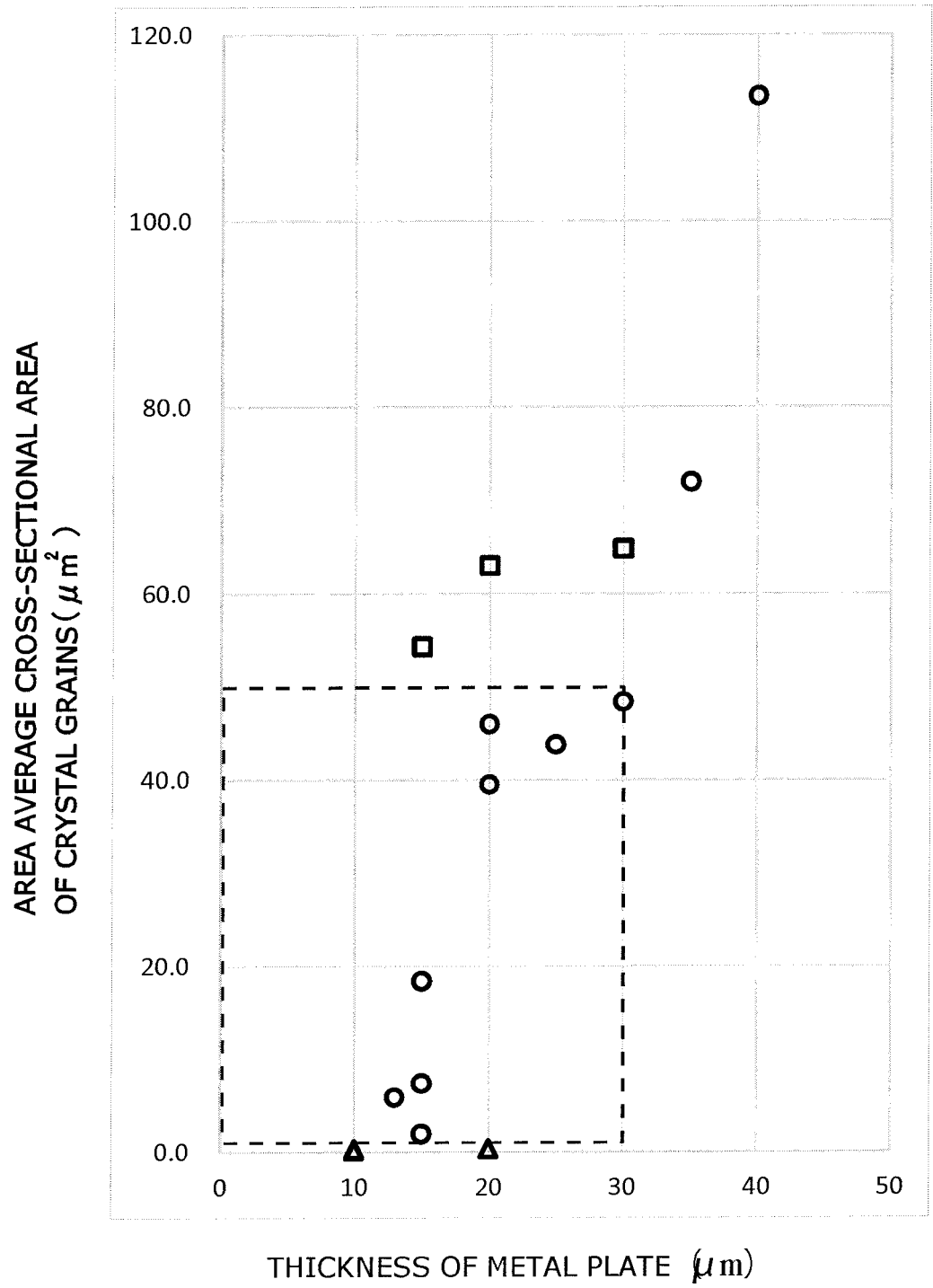
FIG. 26 is a scattering diagram of the metal plate thickness and the area average cross-sectional area of crystal grains according to Examples 1 to 16.

FIG. 26 is a scattering diagram of plots of data on the metal plates 64 in the respective Examples, in which the axis of abscissa represents thickness of the metal plate 64 and the axis of coordinate represents the area average cross-sectional area of crystal grains of the metal plate 64. In FIG. 26, marker "O" represents an example in which the welding strength was 200 mN or more and no deformed portion 28 was formed. Marker "Δ" represents an example in which the welding strength was less than 200 mN. Marker "□" represents an example in which deformed portions 28 were formed. In addition, in FIG. 26, the area surrounded by a dotted line is an area in which the metal plate 64 had a thickness of 30 μm or less and an area average cross-sectional area of crystal grains of from 0.5 $μm^2$ to 50 $μm^2$. As is apparent from FIG. 26, the metal plate 64 was allowed to have strength and weldability in the area surrounded by a dotted line.

Figure 30:
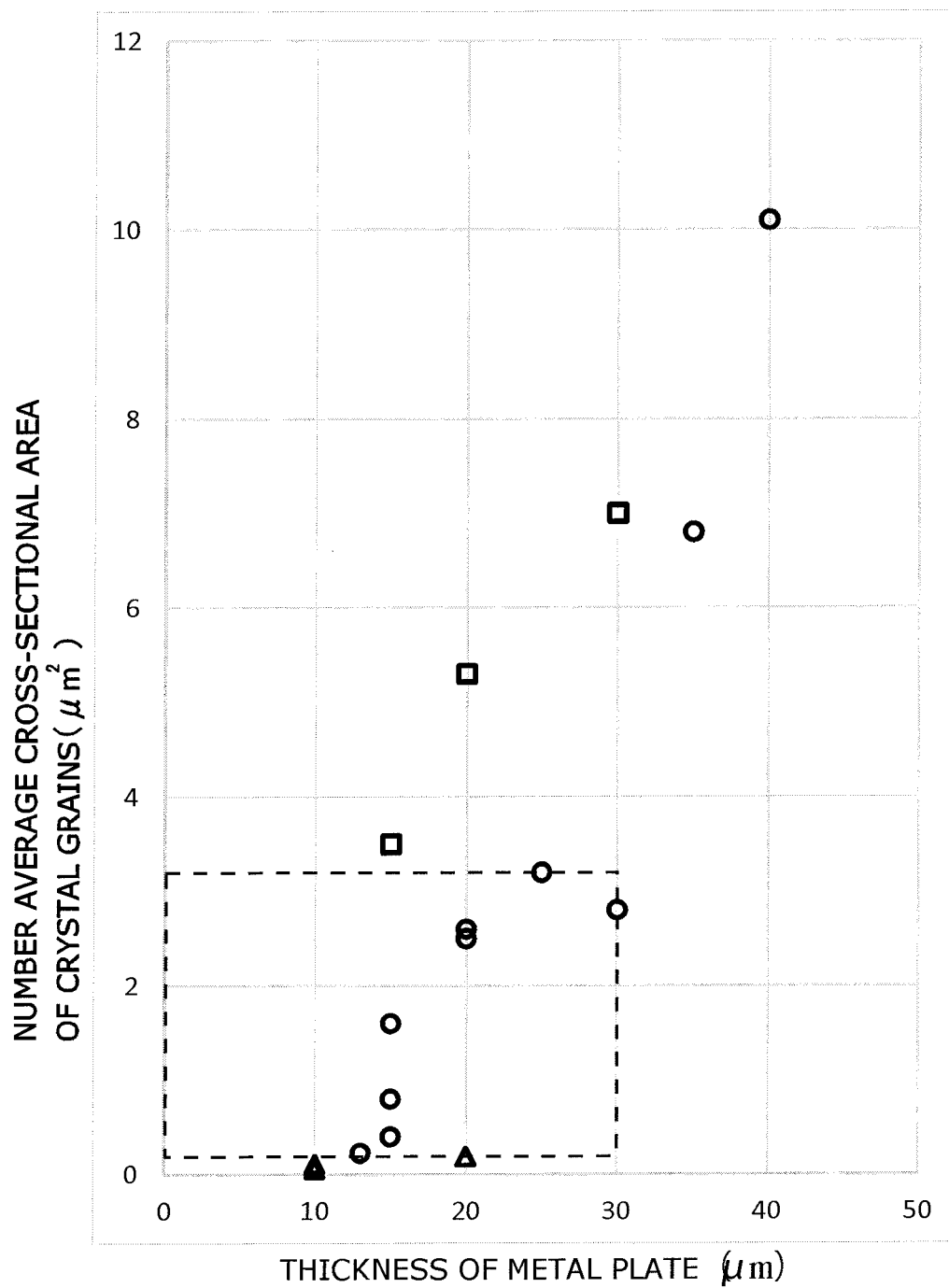
FIG. 30 is a scattering diagram of the metal plate thickness and the number average cross-sectional area of crystal grains according to Examples 1 to 16.

FIG. 30 is a scattering diagram of plots of data on the metal plates 64 in the respective Examples, in which the axis of abscissa represents thickness of the metal plate 64 and the axis of coordinate represents the number average cross-section area of crystal grains of the metal plate 64. In FIG. 30, marker "O" represents an example in which the welding strength was equal to or more than 200 mN and no deformed portion 28 was formed. Marker "Δ" represents an example in which the welding strength was less than 200 mN. Marker "□" represents an example in which deformed portions 28 were formed. In addition, in FIG. 30, the area surrounded by a dotted line is an area in which the metal plate 64 had a thickness of equal to or more than 30 μm and a number average cross-sectional area of crystal grains of from 0.2 $μm^2$ to 3.2 $μm^2$. As is apparent from FIG. 30, the metal plate 64 was allowed to have strength and weldability in the area surrounded by a dotted line.

Figure 31:
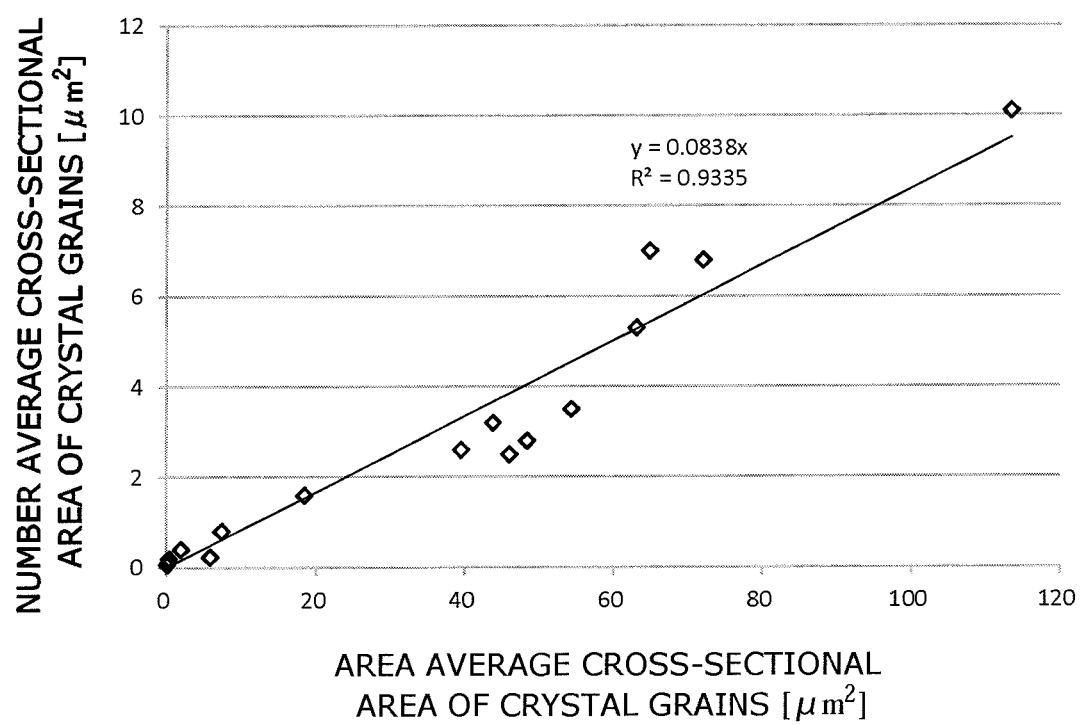
FIG. 31 is a view showing a correlation between the area average cross-sectional area of crystal grains and the number average cross-sectional area of crystal grains according to Examples 1 to 16.

In the graph shown in FIG. 31, the axis of abscissa and the axis of coordinate represent the area average cross-sectional area and the number average cross-sectional area of crystal grains of the metal plates according to Examples 1 to 16. As can be understood from FIG. 31, the area average cross-sectional area of crystal grains in the metal plates according to Examples 1 to 16 correlates with the number average cross-sectional area.

The invention claimed is:

1. A metal plate used for manufacturing a deposition mask,
    wherein the metal plate is made of a rolled steel of an iron alloy containing at least nickel and has a thickness of equal to or less than 30 μm,
    wherein an average cross-sectional area of crystal grains on a cross section of the metal plate is from 0.5 $μm^2$ to 50 $μm^2$, the cross section having an angle of from −10° to +10° with respect to a plane perpendicular to a rolling direction of the metal plate,
    the average cross-sectional area of crystal grains is calculated by analyzing measurement results obtained by an EBSD method, the measurement results being analyzed by an area method under conditions where a portion with a difference in crystal orientation of equal to or more than 5 degrees is recognized as a crystal grain boundary, and wherein the metal plate has no deformed portions.

2. The metal plate according to claim 1, wherein a total content of nickel and cobalt in the rolled steel is from 30% to 38% by mass.

3. The metal plate according to claim 1, wherein the average cross-sectional area of the crystal grains is from 2.0 µm² to 50 µm².

4. The metal plate according to claim 1, wherein the metal plate has a thickness of 13 µm to 30 µm.

5. A deposition mask, comprising: a metal plate;
through-holes formed in the metal plate,
wherein the metal plate is made of a rolled steel of an iron alloy containing at least nickel and has a thickness of equal to or less than 30 µm,
wherein an average cross-sectional area of crystal grains on a cross section of the metal plate is from 0.5 µm² to 50 µm², the cross section having an angle of from −10° to +10° with respect to a plane perpendicular to a rolling direction of the metal plate,
the average cross-sectional area of crystal grains is calculated by analyzing measurement results obtained by an EBSD method, the measuring measurement results being analyzed by an area method under conditions where a portion with a difference in crystal orientation of equal to or more than 5 degrees is recognized as a crystal grain boundary, and wherein the metal plate has no deformed portions.

6. The deposition mask according to claim 5, wherein a total content of nickel and cobalt in the rolled steel is from 30% to 38% by mass.

7. The deposition mask according to claim 5, wherein the average cross-sectional area of the crystal grains is from 2.0 µm² to 50 µm².

8. The deposition mask according to claim 5, wherein the metal plate has a thickness of 13 µm to 30 µm.

9. A deposition mask apparatus, including the deposition mask according to claim 5 and
a frame holding the deposition mask welded thereto.

10. A method for manufacturing a deposition mask, comprising: a step of preparing the metal plate according to claim 1;
a step of transporting the metal plate along a longitudinal direction; and
a step of forming through-holes in the metal plate.

11. A method for manufacturing a metal plate used for manufacturing a deposition mask, comprising
a preparation step of obtaining the metal plate which is made of an iron alloy containing at least nickel and has a thickness of equal to or less than 30 µm in the form of a rolled steel by rolling,
wherein an average cross-sectional area of crystal grains on a cross section of the metal plate is from 0.5 µm² to 50 µm², the cross section having an angle of from −10° to +10° with respect to a plane perpendicular to a rolling direction of the rolled steel, and
wherein the average cross-sectional area of crystal grains is calculated by analyzing measurement results obtained by an EBSD method, the measurement results being analyzed by an area method under conditions where a portion with a difference in crystal orientation of equal to or more than 5 degrees is recognized as a crystal grain boundary, and wherein the metal plate has no deformed portions.

12. The method for manufacturing a metal plate according to claim 11, wherein the preparation step includes an annealing step of annealing the metal plate obtained by rolling at from 500° C. to 600° C. for 30 to 90 seconds during transport.

13. A method for manufacturing a metal plate used for manufacturing a deposition mask, comprising:
a preparation step of obtaining the metal plate which is made of an iron alloy containing at least nickel and has a thickness of equal to or less than 30 µm in the form of plating film by plating,
wherein an average cross-sectional area of crystals grains on a cross section of the metal plate is from 0.5 µm² to 50 µm², the cross section having an angle of from −10° to +10° with respect to a plane perpendicular to a longitudinal direction of the plating film,
wherein the average cross-sectional area of crystals grains is calculated by analyzing measurement results obtained by an EBSD method, the measuring results being analyzed by an area method under conditions where a portion with a difference in crystal orientation of 5 degrees or more is recognized as a crystal grain boundary, and wherein the metal plate has no deformed portions.

14. The method for manufacturing a metal plate according to claim 13, wherein the preparation step includes: a step of forming a plating film on a surface of a drum partially immersed in a plating liquid while rotating the drum; and a step of obtaining the metal plate made of the plating film in the elongated form by removing the plating film from the drum.

* * * * *